(12) United States Patent
Kumazawa et al.

(10) Patent No.: US 8,130,364 B2
(45) Date of Patent: Mar. 6, 2012

(54) PROJECTION OPTICAL APPARATUS, EXPOSURE METHOD AND APPARATUS, PHOTOMASK, AND DEVICE AND PHOTOMASK MANUFACTURING METHOD

(75) Inventors: Masato Kumazawa, Sagamihara (JP); Hitoshi Hatada, Sagamihara (JP)

(73) Assignee: Nikon Corporation, Tokyo (JP)

( * ) Notice: Subject to any disclaimer, the term of this patent is extended or adjusted under 35 U.S.C. 154(b) by 996 days.

(21) Appl. No.: 12/000,074

(22) Filed: Dec. 7, 2007

(65) Prior Publication Data

US 2008/0165334 A1 Jul. 10, 2008

Related U.S. Application Data

(60) Provisional application No. 60/878,383, filed on Jan. 4, 2007.

(51) Int. Cl.
*G03B 27/54* (2006.01)
*G03B 27/42* (2006.01)
*G03B 27/52* (2006.01)

(52) U.S. Cl. ............................. 355/67; 355/53; 355/55

(58) Field of Classification Search .................... 355/53, 355/67, 55; 430/5
See application file for complete search history.

(56) References Cited

U.S. PATENT DOCUMENTS

| | | | |
|---|---|---|---|
| 6,512,573 | B2 | 1/2003 | Fürter |
| 2002/0039180 | A1 | 4/2002 | Furter |
| 2007/0236676 | A1 | 10/2007 | Kato |
| 2008/0013061 | A1 | 1/2008 | Kato |
| 2008/0165333 | A1 | 7/2008 | Kumazawa et al. |
| 2009/0009735 | A1 | 1/2009 | Kato |

FOREIGN PATENT DOCUMENTS

| | | |
|---|---|---|
| EP | 1 107 064 A2 | 6/2001 |
| WO | WO 94/11781 | 5/1994 |
| WO | WO 2007/003563 A1 | 1/2007 |
| WO | WO 2007/119292 A1 | 10/2007 |

OTHER PUBLICATIONS

Jul. 16, 2009 Written Opinion in International Application No. PCT/JP2007/075359.
May 21, 2008 International Search Report and Written Opinion in International Application No. PCT/JP2007/075359.

*Primary Examiner* — Edward Glick
*Assistant Examiner* — Deoram Persaud
(74) *Attorney, Agent, or Firm* — Oliff & Berridge, PLC

(57) ABSTRACT

When forming a magnified image of a mask pattern on an object with a plurality of projection optical systems, projected images of the projection optical systems are formed to be accurately continuous to enable satisfactory pattern transfer. A first projection optical system directs light beam from point a on a mask to point A on a plate and forms a magnified image of the mask on the plate. A second projection optical system directs light beam from point b on the mask to point on the plate and forms a magnified image of the mask on the plate. A first line segment linking point A and point a', which orthogonally projects point a on the plate, and a second line segment linking point B and point b', which orthogonally projects point b on the plate PT, overlap each other as viewed in a non-scanning direction.

21 Claims, 25 Drawing Sheets

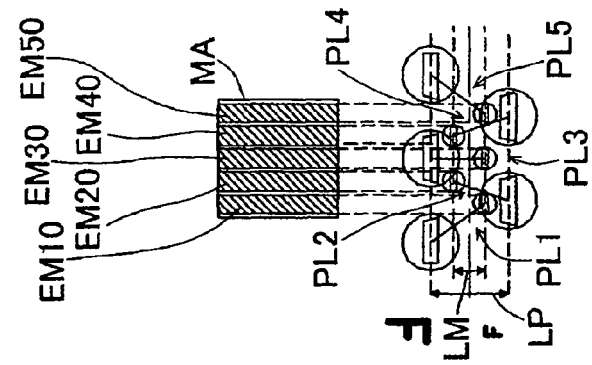
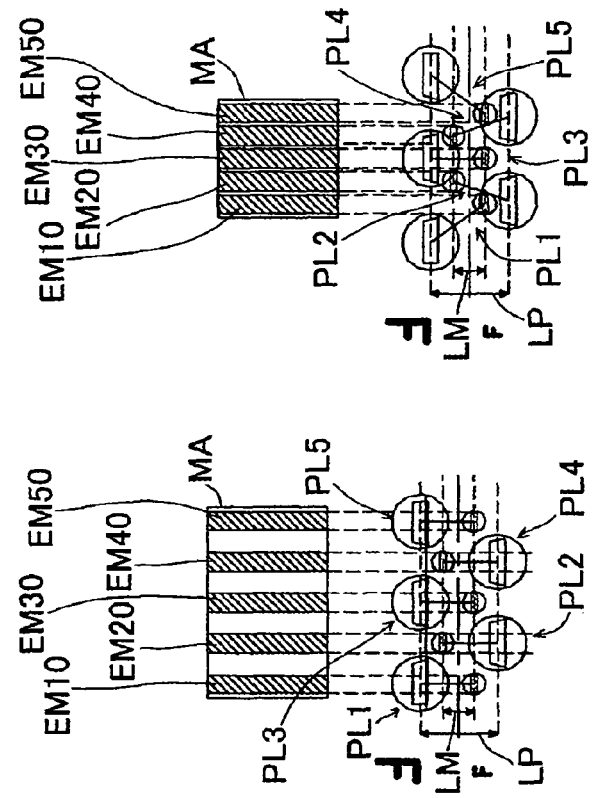
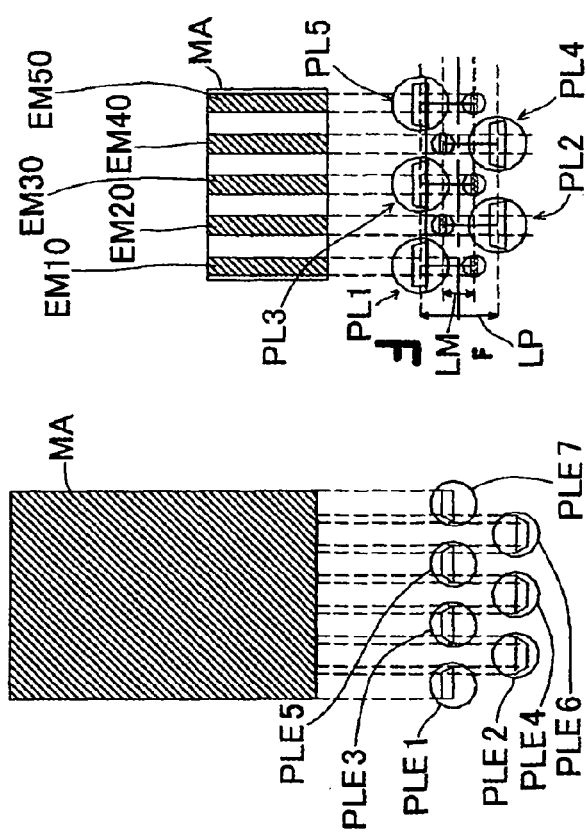
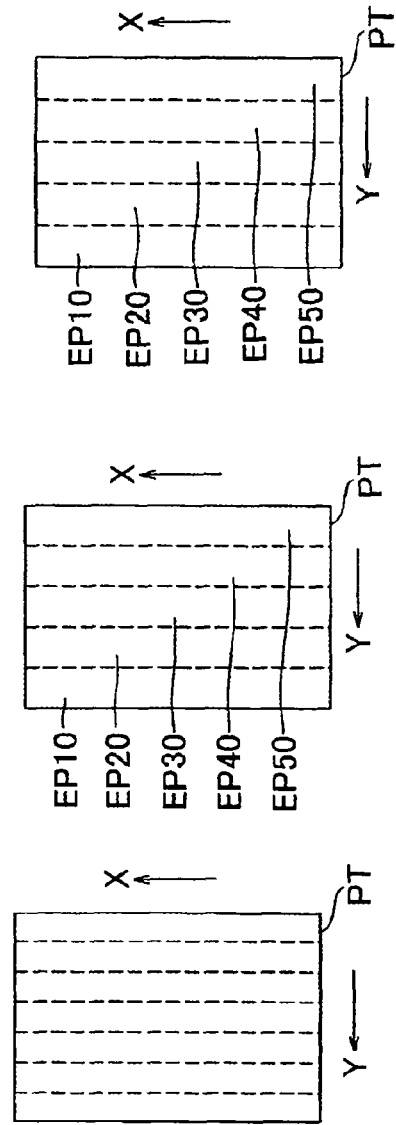

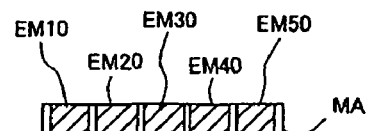
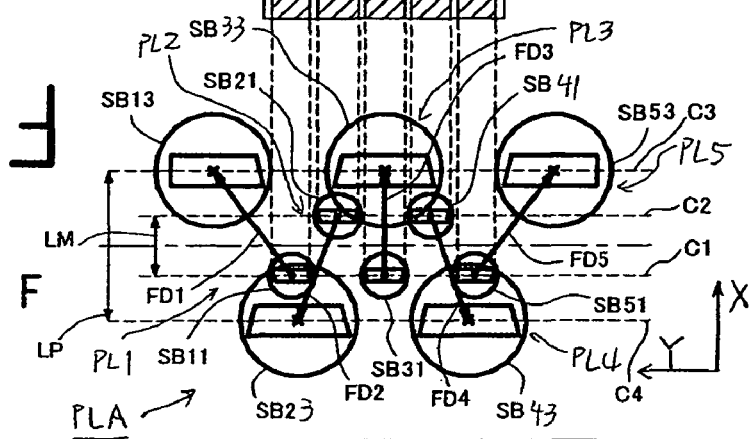
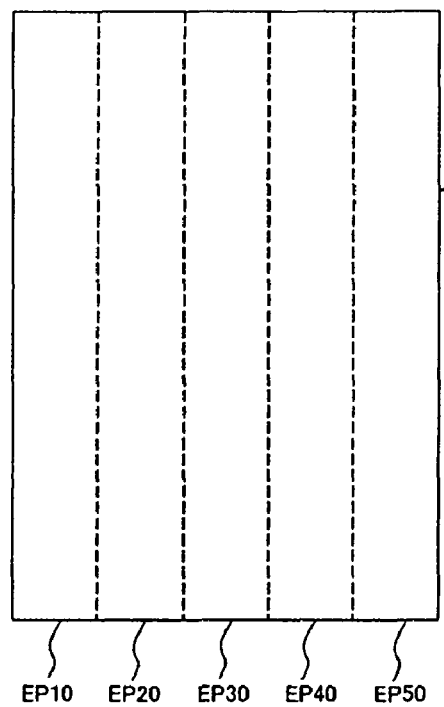
Fig.14(A)
Fig.14(B)
Fig.14(C)

Fig.16(A) Fig.16(B) Fig.16(C) Fig.16(D)
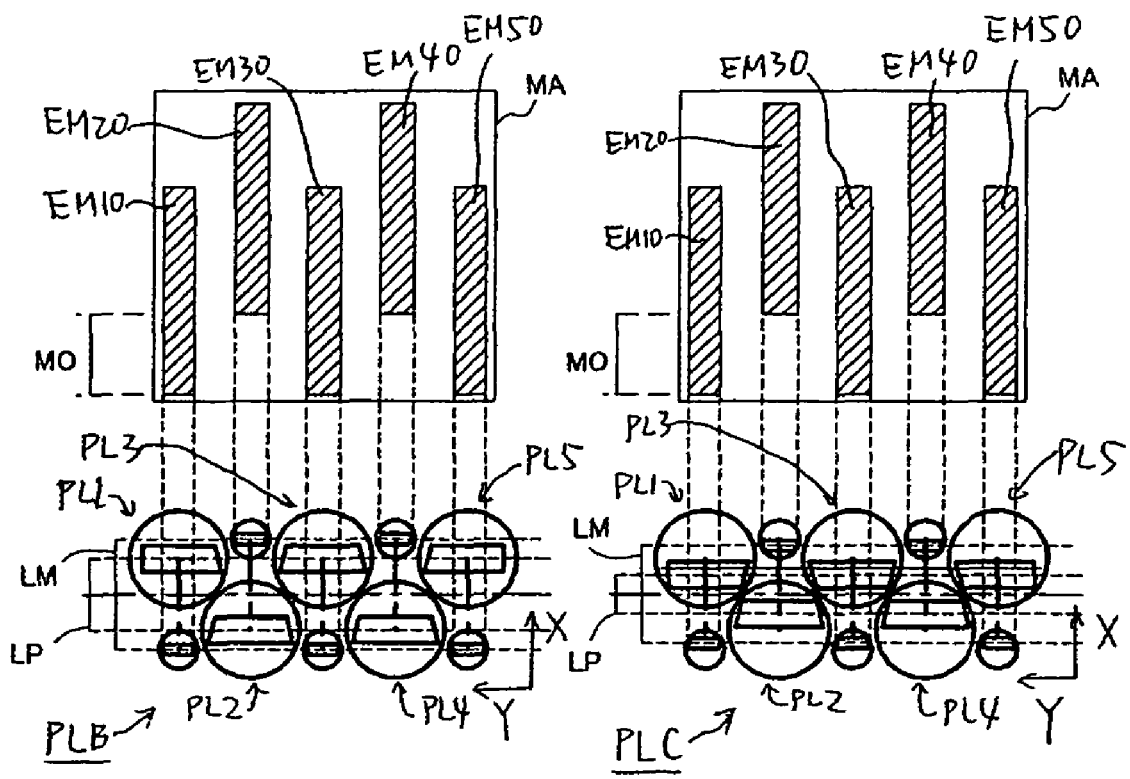
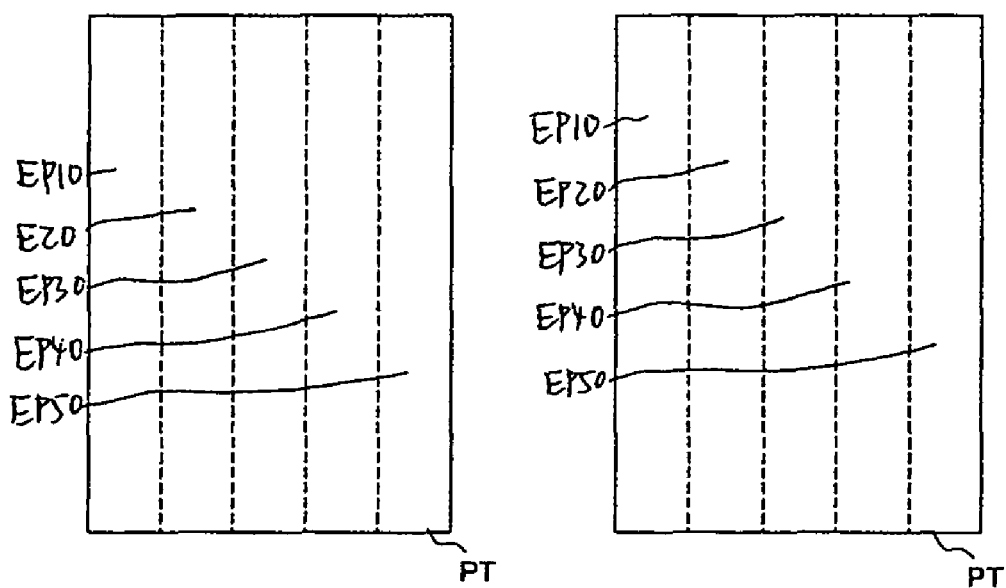

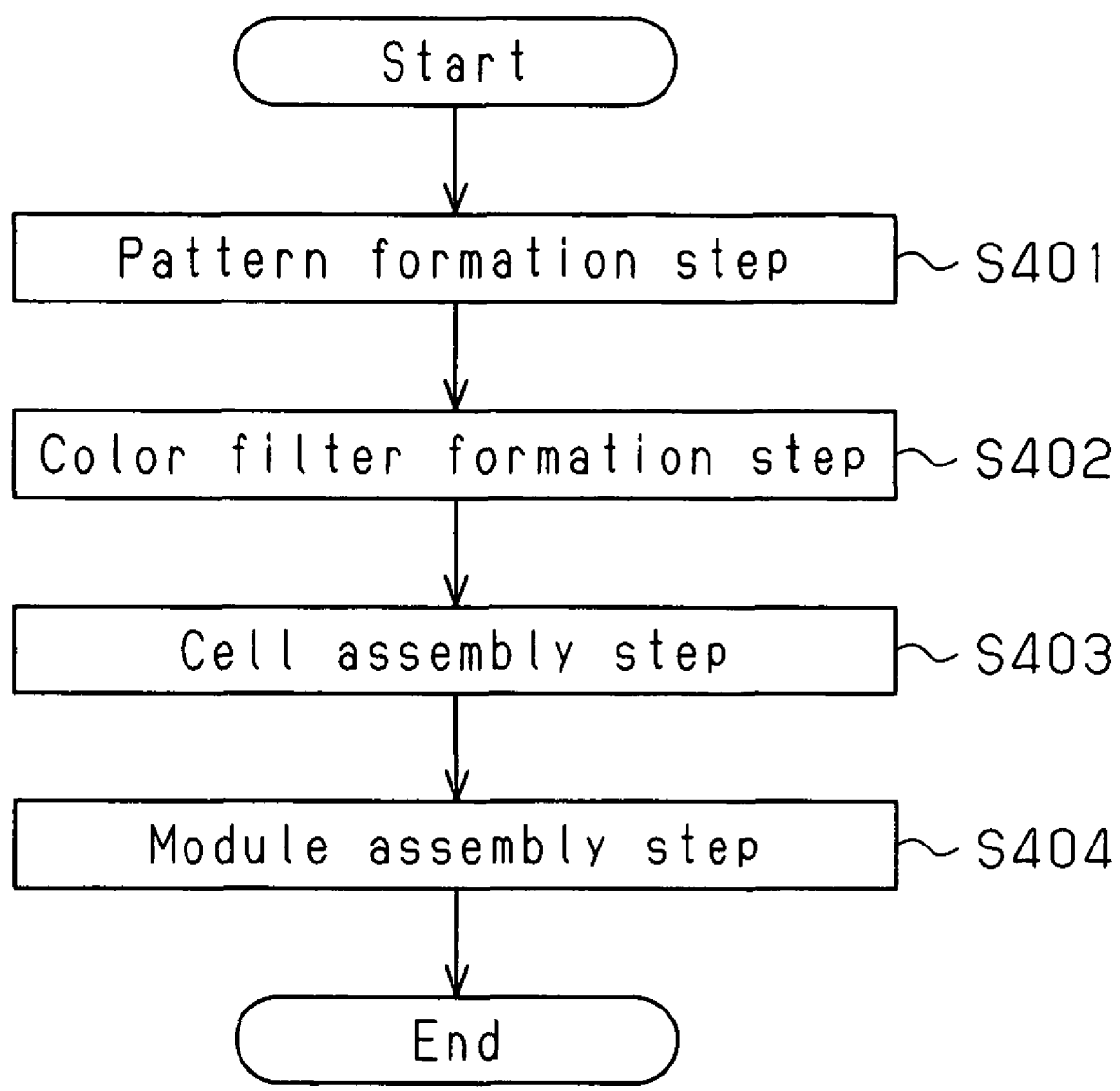

PROJECTION OPTICAL APPARATUS, EXPOSURE METHOD AND APPARATUS, PHOTOMASK, AND DEVICE AND PHOTOMASK MANUFACTURING METHOD

CROSS-REFERENCE TO RELATED APPLICATIONS

This application is based upon and claims the benefit of priorities from U.S. Provisional Application No. 60/878,383 filed on Jan. 4, 2007, the entire contents of which are incorporated herein by reference.

BACKGROUND OF THE INVENTION

The present invention relates to a projection optical apparatus for forming a magnified image of a first object such as a mask onto a second object such as a photosensitive substrate, and to an exposure technique and a device manufacturing technique using such a projection optical apparatus. The present invention further relates to a photomask on which a pattern transferred by the projection optical apparatus is formed and to a method for manufacturing such a photomask.

A projection exposure apparatus, which projects a pattern of a mask (e.g., reticle or photomask) onto a resist-coated plate (e.g., glass plate or semiconductor wafer) using a projection optical system, is used when manufacturing devices such as semiconductor devices and liquid crystal display devices. A projection exposure apparatus employing a step-and-scan method (stepper) has been widely used in the prior art. The step-and-scan projection exposure apparatus performs batch exposure of mask patterns onto a plurality of shot-regions defined on a plate. A step-and-scan scanning projection exposure apparatus, which uses a plurality of small partial projection optical systems having the same magnification, instead of a single large projection optical system has been proposed recently. In the scanning projection exposure apparatus, the plurality of partial projection optical systems are arranged at predetermined intervals in a number of rows along a scanning direction. The scanning projection exposure apparatus exposes patterns of a mask using the partial projection optical systems onto a plate while scanning the mask and the plate.

Each partial projection optical system of the conventional scanning projection exposure apparatus includes a catadioptric system, which forms an intermediate image using for example a concave mirror (or simply a mirror) and a lens, and further includes another catadioptric system. Each partial projection optical system forms an erect image of a pattern of the mask onto the plate with the same magnification.

In recent years, the plates that are used have become large and may have a size of as large as 2×2 meters are increasingly used. When the above-described step-and-scan exposure apparatus, which includes the partial projection optical systems having the same magnification, is used to perform exposure on such a large plate, the mask is also enlarged. A larger mask results in higher costs due to the need to maintain flatness of the mask substrate and the more complicated manufacturing process that becomes necessary when the mask is enlarged. Further, masks in four to five layers are usually necessary to form, for example, a thin-film transistor portion of a liquid crystal display device. This further increases costs. Accordingly, a scanning projection exposure apparatus that can reduce the size of a mask pattern has been proposed (refer, for example, to U.S. Pat. No. 6,512,573). The scanning projection exposure apparatus uses a multiple lens system that includes a plurality of partial projection optical systems having magnifications enabling enlargement instead of equal magnifications. In this scanning projection exposure apparatus, the partial projection optical systems are arranged in two rows in the scanning direction.

However, each partial projection optical system of the conventional enlargement magnification multiple-lens system has an optical axis on the mask and an optical axis on the plate arranged at substantially the same positions. Thus, a pattern exposed onto the plate by a partial projection optical system in one row and a pattern exposed onto the plate by a partial projection optical system in the other row are not continuous with one another.

SUMMARY OF THE INVENTION

Accordingly, it is an object of the present invention to provide a projection technique and an exposure technique for enabling optimum pattern transfer when a magnified image of a mask pattern is formed on an object, such as a plate, using a plurality of projection optical systems (partial projection optical systems), and a device manufacturing technique using the exposure technique.

It is another object of the present invention to provide a photomask for use in the projection technique and the exposure technique and a technique for manufacturing the photomask.

A first aspect of the present invention is a projection optical apparatus for forming a magnified image of a first object on a second object. The first object is arranged in a first plane, and the second object is arranged in a second plane relatively movable to the magnified image in a predetermined first direction. A first view point and a second view point are set in the first plane, and a first conjugate point and a second conjugate point respectively corresponding to the first view point and the second view point are set in the second plane. The apparatus includes a first projection optical system for directing light beam from the first view point to the first conjugate point and forming a magnified image of the first object in the first plane on the second object in the second plane. A second projection optical system directs light beam from the second view point to the second conjugate point and forms a magnified image of the first object in the first plane on the second object in the second plane. The first projection optical system includes a first light beam transfer member for transferring the light beam from the first view point to the first conjugate point by shifting the light beam in the first direction from the first view point. The second projection optical system includes a second light beam transfer member for transferring the light beam from the second view point to the second conjugate point by shifting the light beam in the first direction from the second view point.

A second aspect of the present invention is a projection optical apparatus for forming a magnified image of a first object on a second object. The first object is arranged in a first plane, and the second object is arranged in a second plane spaced from the first plane relatively movable to the magnified image in a predetermined first direction. The apparatus includes a first-row projection optical system including a plurality of projection optical systems, each having a viewing field on a first row extending along a second direction that intersects the scanning direction. A second-row projection optical system includes a plurality of projection optical systems, each having a viewing field on a second row extending along the second direction and differing from the first row. The first-row projection optical system forms, on the second plane, a plurality of image fields conjugate to the plurality of viewing fields of the first-row projection optical system along a third row. The second-row projection optical system forms, on the second plane, a plurality of image fields conjugate to the plurality of viewing fields of the second-row projection optical system along a fourth row. The first row is between the second row and the fourth row and the second row is between the first row and the third row when the first to fourth rows are viewed in a direction linking the first plane and the second plane.

A third aspect of the present invention is a projection exposure apparatus for exposing a second object with illumination light via a first object. The apparatus includes an illumination optical system for illuminating the first object with the illumination light. A projection optical apparatus according to the above aspect forms an image of the first object illuminated by the illumination optical system on the second object. A stage mechanism relatively moves the first object and the second object in the first direction using enlargement magnification of the projection optical apparatus as a velocity ratio.

A fourth aspect of the present invention is a projection exposure apparatus for exposing a first object arranged in a first plane and a second object arranged in a second plane while relatively moving the first object and the second object in a predetermined scanning direction. The first plane includes a first viewing field and a second viewing field, and the second plane includes a first projection field and a second projection field. The apparatus includes a first projection optical system for projecting a magnified image of part of the first object in the first viewing field onto the first projection field of the second plane. A second projection optical system projects a further magnified image of part of the first object in the second viewing field onto the second projection field of the second plane. A stage mechanism relatively moves the first object and the second object in the scanning direction using enlargement magnification related with the scanning direction as a velocity ratio. The enlargement magnification of the first projection optical system and the second projection optical system related with the scanning direction is less than −1.

A fifth aspect of the present invention is an exposure method for exposing a second object with illumination light via a first object. The method includes illuminating the first object with the illumination light, projecting an image of the illuminated first object onto the second object with a projection optical apparatus according to the above aspect, and relatively moving the first object and the second object using the enlargement magnification of the projection optical apparatus as a velocity ratio.

A sixth aspect of the present invention is a device manufacturing method including an exposure step of exposing a mask pattern onto a photosensitive substrate using a projection exposure apparatus according to the above aspect and a development step of developing the photosensitive substrate that has been exposed in the exposure step.

A seventh aspect of the present invention is a photomask for transferring a pattern onto a predetermined substrate. The photomask includes a first-row pattern part and a second-row pattern part spaced from each other in a first direction on the photomask. The first-row pattern part includes a first inverted pattern obtained by inverting a pattern in a first original pattern field, which is part of an original pattern corresponding to the pattern transferred onto the predetermined substrate, using the first direction as an axis of symmetry. The second-row pattern part includes a second inverted pattern obtained by inverting a pattern in a second original pattern field, which differs from the first original pattern field, using the first direction as an axis of symmetry. The first-row pattern part and the second-row pattern part include a common inverted pattern obtained by inverting an original pattern in a common field between the first original pattern field and the second original pattern field using the first direction as an axis of symmetry.

An eighth aspect of the present invention is a method for manufacturing a photomask according to the above aspect. The method includes preparing the original pattern, extracting first pattern data, which is data of the original pattern in the first original pattern field that is part of the original pattern, second pattern data, which is data of the original pattern in the second original pattern field that differs from the first original pattern field, and common pattern data, which is data of the original pattern in a common pattern field between the first and second pattern fields, inverting the first pattern data, the second pattern data, and the common pattern data using the first direction as an axis of symmetry to obtain first inverted pattern data, second inverted pattern data, and common inverted pattern data, and writing the first inverted pattern data and the common inverted pattern data to a first field on the photomask and writing the second inverted pattern data and the common inverted pattern data to a second field on the photomask to form the first-row pattern part and the second-row pattern part.

A ninth aspect of the present invention is a photomask for transferring a pattern onto a predetermined substrate with first and second projection optical systems having a predetermined projection magnitude. The photomask includes a first pattern part and a second pattern part spaced from each other in a first direction on the photomask. A first transfer field in which the first pattern part is transferred onto the substrate by the first projection optical system and a second transfer field in which the second pattern part is transferred onto the substrate by the second projection optical system are partially overlapped with each other in a second direction of the substrate. The distance between the center of the first transfer field and the center of the second transfer field in the second direction differs from the distance between the center of the first pattern part and the center of the second pattern part in the first direction.

The projection optical apparatus and the first projection optical apparatus of the above aspect, using, for example, light beam transfer members, transfers light beam from two view points or two rows of view points of two projection optical systems or two rows of projection optical systems so that the light beams are transferred on a second object in opposite directions along a first direction. The second projection exposure apparatus of the above aspect includes two projection optical systems, each forming a magnified inverted image in a scanning direction, and transfers light beam from two view points of the two projection optical systems so that the light beams are transferred on a second object in opposite directions along the scanning direction. As a result, images formed in pattern fields on the first object are projected by the two projection optical systems or by the two-rows of projection optical systems and are formed on the second object in a manner that the images are continuous to one another. This enables optimum pattern transfer.

The amount of light beam transferred by a first light beam transfer member and the amount of light beam transferred by a second light beam transfer member at least overlap each other as viewed in a second direction. The amount of light beam transferred from a view point to an image point by the first-row projection optical system and the amount of light beam transferred from a view point to an image point by the second-row projection optical system overlap with each other as viewed in the second direction. This means that the first and second projection optical systems are in a nested arrangement and the first-row and second-row projection optical systems are in a nested arrangement. This arrangement enables miniaturization of the entire projection optical apparatus, and reduces image oscillation, which may occur when the apparatus is subjected to disturbance such as vibration.

The offset of the position of each pattern field on the first object in the first direction (scanning direction), which is subjected to projection performed by the two projection optical systems or the two rows of projection optical systems, and the scanning distance of the second object during scanning exposure are optimized in a well-balanced manner by adjusting the overlap amount etc. of the light beam transfer amount etc. The offset may be set to zero as necessary. In this case, the base member of the stage of the first object may be reduced in size. As a result, the pattern is formed with a higher precision. When the scanning distance is shortened, the base member of the stage of the second object may be reduced in size. Further, the exposure time is shortened and the exposure throughput is improved.

With the photomask of the above aspect, the first and second projection optical systems of the projection optical apparatus of the above aspect enable projection of the image of a pattern of its first row pattern part and its second row pattern part to be projected. Further, the photomask of the above aspect enables use of the projection optical apparatus of the present invention.

BRIEF DESCRIPTION OF THE DRAWINGS

FIG. 11(A) is a diagram schematically showing exposure performed using a plurality of projection optical systems each having a one-to-one projection ratio, FIG. 11(B) is a diagram schematically showing exposure performed using a plurality of projection optical systems according to the first embodiment, and FIG. 11(C) schematically shows an exposure method that enables a mask to be downsized also in a non-scanning direction;

FIG. 14 is a diagram showing a projection optical apparatus PLA according to a second embodiment of the present invention and also shows the positional relationship between a mask and a plate;

FIG. 16(A) is a plan view of the projection optical system PLB and the mask MA shown in FIG. 15, FIG. 16(B) is a plan view of a plate PT shown in FIG. 15, FIG. 16(C) is a diagram showing an off-axis projection optical apparatus PLC and a mask, and FIG. 16(D) is a diagram showing a plate exposed using the projection optical apparatus PLC;

FIG. 25 is a flowchart showing manufacturing processes for a liquid crystal display device using the projection exposure apparatus according to the embodiments of the present invention.

DETAILED DESCRIPTION OF THE PREFERRED EMBODIMENTS

First Embodiment

A first embodiment of the present invention will now be described with reference to FIGS. 1 to 12.

Figure 1:
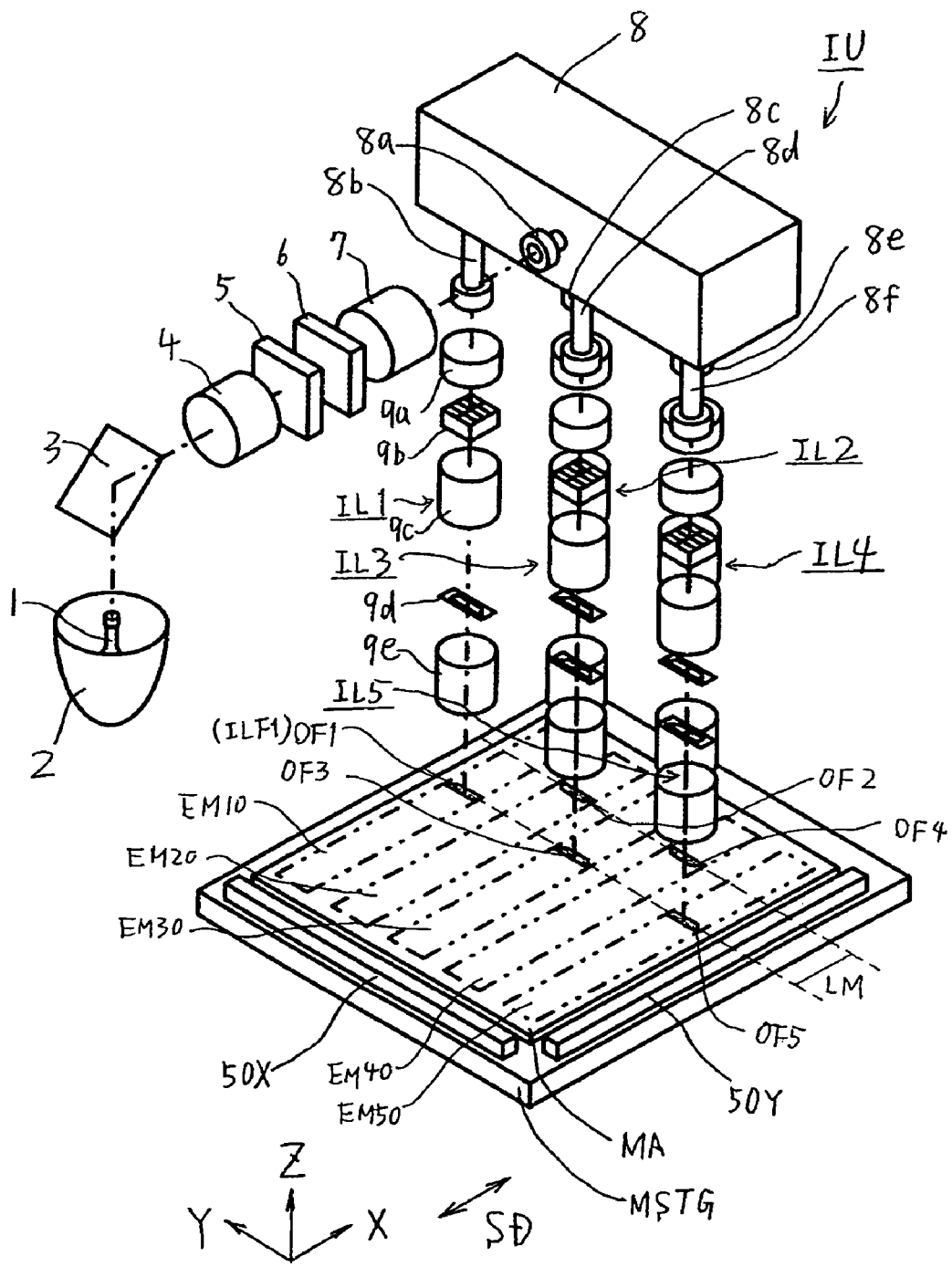
FIG. 1 is a perspective view showing an illumination unit and a mask stage of a projection exposure apparatus according to a first embodiment.
Figure 2:
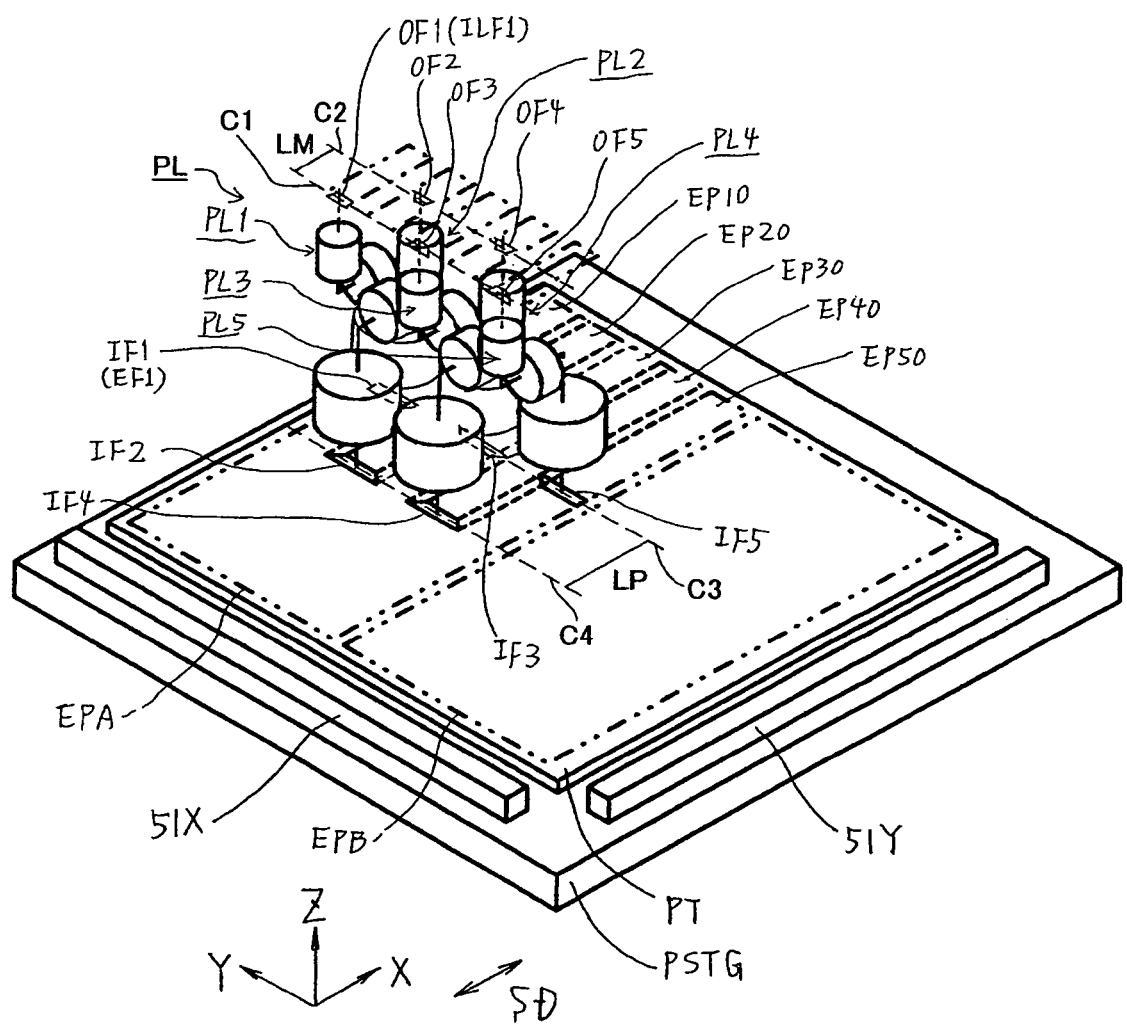
FIG. 2 is a perspective view showing a projection optical apparatus according to the first embodiment and its substrate stage.

FIG. 1 shows a schematic structure of an illumination unit and a mask stage of a scanning projection exposure apparatus employing a step-and-scan method in the first embodiment. FIG. 2 shows a schematic structure of a projection optical apparatus and a substrate stage of the projection exposure apparatus. In FIGS. 1 and 2, the projection exposure apparatus includes an illumination unit IU, a mask stage MSTG, a projection optical system PL, a substrate stage PSTG, a drive mechanism (not shown), and a control unit (not shown). The illumination unit IU illuminates a pattern of a mask MA (first object) with illumination light emitted from a light source. The mask stage MSTG holds and moves the mask MA. The projection optical system PL projects a magnified image (an image with an enlargement magnification) of the pattern of the mask MA onto a plate (substrate) PT (second object). The substrate stage PSTG holds and moves the plate PT. The drive mechanism includes, for example, linear motors for driving the mask stage MSTG and the substrate stage PSTG. The control unit centrally controls the operation of the drive mechanism etc. The plate PT of may be, for example, a flat glass plate having a rectangular shape of 1.9×2.2 m, 2.2×2.4 m, 2.4×2.8 m, or 2.8×3.2 m. The plate PT is coated with photoresist (photosensitive material) for manufacturing a liquid crystal display device. The surface of the plate PT may be, for example, separated in two pattern transfer fields EPA and EPB, on each of which a pattern of the mask MA is to be transferred. A ceramic substrate for manufacturing a thin-film magnetic head or a circular semiconductor wafer for manufacturing a semiconductor device may be used as the plate PT.

In the illumination unit IU shown in FIG. 1, light beams emitted from the light source 1, which is for example an ultrahigh-pressure mercury lamp, are reflected by an elliptical mirror 2 and a dichroic mirror 3 and then enter a collimating lens 4. A reflection coating of the elliptical mirror 2 and a reflection coating of the dichroic mirror 3 selectively reflect light with a certain wavelength range, or specifically reflect light including g-line (with a wavelength of 436 nm), h-line (with a wavelength of 405 nm), and i-line (with a wavelength of 365 nm). As a result, the light including the g, h, and i-lines enters the collimating lens 4. With the light source 1 arranged at a first focal position of the elliptical mirror 2, the light including the g, h, and i-lines forms a light source image at a second focal position of the elliptical mirror 2. Divergent light beams from the light source image are converted to collimated light beams by the collimating lens 4, and the collimated light beams pass through a wavelength selective filter 5, which only allows passage of light beams in a predetermined exposure wavelength range.

The illumination light that has passed through the wavelength selective filter 5 passes through a neutral density filter 6, and then is converged by a converging lens 7 into a light inlet 8a of a light guide fiber unit 8. The light guide fiber unit 8 may be, for example, a random guide fiber unit, which is formed by randomly combining a large number of fibers. The light guide fiber unit 8 has the light inlet 8a and five light outlets 8b, 8c, 8d, 8e, and 8f. The illumination light that has entered through the light inlet 8a of the light guide fiber unit 8 propagates inside the light guide fiber unit 8 and then separately emitted from the five light outlets 8b to 8f. The light emitted from the five light outlets 8b to 8f enters five partial illumination optical systems IL1, IL2, IL3, IL4, and IL5, each of which partially illuminates the mask MA.

The illumination light emitted from each of the light outlets 8b to 8f of the light guide fiber unit 8 enters the corresponding one of the partial illumination optical systems IL1 to IL5, and is collimated by a collimating lens 9a, which is arranged in the vicinity of each of the light outlets 8b to 8f. The collimated light then enters a fly's eye lens array 9b, which is an optical integrator. Illumination light from a large number of secondary light sources, which are formed on a rear-side focus surface of the fly's eye lens array 9b of each of the partial illumination optical systems IL1 to IL5, illuminates a variable field stop 9d via a converging lens 9c. Light beams from the variable viewing field diaphragms 9d illuminate viewing fields OF1, OF2, OF3, OF4, and OF5 on the mask MA via condenser lenses 9e in a substantially uniform manner. It is an illumination field ILF1 or the like having a predetermined shape defined in each of the viewing fields (fields of view) OF1 to OF5 by the variable field stop 9d that is actually illuminated. However, the viewing fields OF1 to OF5 having predetermined shapes will be hereafter described as fields that are illuminated.

Light from the viewing fields OF1 to OF5 formed on the mask MA exposes image fields IF1, IF2, IF3, IF4, and IF5 formed on the plate PT via the corresponding first, second, third, fourth, and fifth projection optical systems PL1, PL2, PL3, PL4, and PL5 shown in FIG. 2. The projection optical systems PL1 to PL5 are telecentric to the side of the mask MA and the side of the plate PT. It is a projection field EF1, which is conjugate to the illumination field ILF1 or the like, defined in each of the image fields IF1 to IF5 that is actually exposed. However, the image fields IF1 to IF5 will hereafter be described as fields that are exposed. In the present embodiment, the five projection optical systems (partial projection optical systems) PL1 to PL5 form the projection optical apparatus PL. The projection optical systems PL1 to PL5 form magnified images of patterns included in the viewing fields OF1 to OF5 formed on the mask MA (first plane) onto the image fields IF1 to IF5 formed on the surface of the plate PT (second plane) with a common enlargement magnification M, which is common to all the projection optical systems PL1 to PL5.

In the present embodiment, each of the projection optical systems PL1 to PL5 forms an inverted image of a pattern of the mask MA onto the plate PT. Accordingly, the enlargement magnification M is smaller than −1. For example, the enlargement magnification M may be −2.5 (2.5×). In the present embodiment, the surface on which the mask MA is mounted and the surface on which the plate PT is mounted are parallel to each other. Hereafter, X-axis is defined as extending along a scanning direction SD of the mask MA and the plate PT during scanning exposure within a plane parallel to the mounting surface of the plate PT, Y-axis is defined as extending along a non-scanning direction that is orthogonal to the scanning direction within the plane parallel to the mounting surface of the plate PT, and Z-axis is defined as extending along a direction vertical to the mounting surface of the plate PT. In this case, the pattern surface of the mask MA and the surface of the plate PT are parallel to the XY plane. The scanning direction of the mask MA and the plate PT is the direction in the X-axis (X-direction). The non-scanning direction of the mask MA and the plate PT is the direction in the Y-axis (Y-direction).

In FIG. 1, the mask MA is attracted to and held on the mask stage MSTG by a mask holder (not shown). An X-axis movable mirror 50X and a Y-axis movable mirror 50Y are fixed on the mask stage MSTG. A first laser interferometer (not shown) is arranged to face the X-axis and Y-axis movable mirrors 50X and 50Y. The first laser interferometer measures the position of the mask stage MSTG and provides the measurement result to a stage drive unit (not shown). In FIG. 2, the plate PT is attracted to and held on the substrate stage PSTG by a substrate holder (not shown). An X-axis movable mirror 51X and a Y-axis movable mirror 51Y are fixed on the substrate stage PSTG. A second laser interferometer (not shown) is arranged to face the X-axis and Y-axis movable mirrors 51X and 51Y. The second laser interferometer measures the position of the substrate stage PSTG and provides the measurement result to the stage drive unit (not shown). The stage drive unit controls the position and the moving velocity of the mask stage MSTG and the substrate stage PSTG based on the measurement values of the first and second laser interferometers. During scanning exposure, the substrate stage PSTG is driven in the X-direction at velocity M*VM (where M is the enlargement magnification of the projection optical systems PL1 and PL5) in synchronization with the mask stage MSTG that is driven in the X-direction at a velocity VM. In the present embodiment, the enlargement magnification M is a negative value. Thus, the mask stage MSTG and the substrate stage PSTG are scanned in opposite directions along the X-axis.

The partial illumination optical systems IL1, IL3, and IL5 shown in FIG. 1 are arranged at predetermined intervals in the Y-direction (non-scanning direction) to form a first row. In the same manner, the projection optical systems PL1, PL3, and PL5 in FIG. 2 corresponding to the partial illumination optical systems IL1, IL3, and IL5 are also arranged in the Y-direction to form a first row. The partial illumination optical systems IL2 and IL4 are arranged at predetermined intervals in the Y-direction to form a second row. The partial illumination optical systems IL2 and IL4 in the second row are shifted in the (+)X-direction from the first row. The projection optical systems PL2 and PL4, which correspond to the partial illumination optical systems IL2 and IL4, are also arranged at in the Y-direction in the same manner.

Although not shown, an off-axis alignment unit and an autofocusing unit are arranged in the vicinity of the first-row projection optical systems and the second-row projection optical systems. The off-axis alignment unit aligns the plate PT. The autofocusing unit measures the Z-direction positions of the mask MA and the plate PT (focus positions). In the same manner, an alignment unit (not shown) for aligning the mask MA is also arranged on the mask MA. The alignment units are used to align the mask MA and the plate PT to perform exposure in an overlapped manner on the plate PT. Based on the measurement results of the autofocusing unit, a Z-drive mechanism (not shown) is used to adjust, for example, the Z-direction position of the mask stage MSTG, to focus the imaging surfaces of the projection optical systems PL1 to PL5 with the surface of the plate PT.

Figure 3:
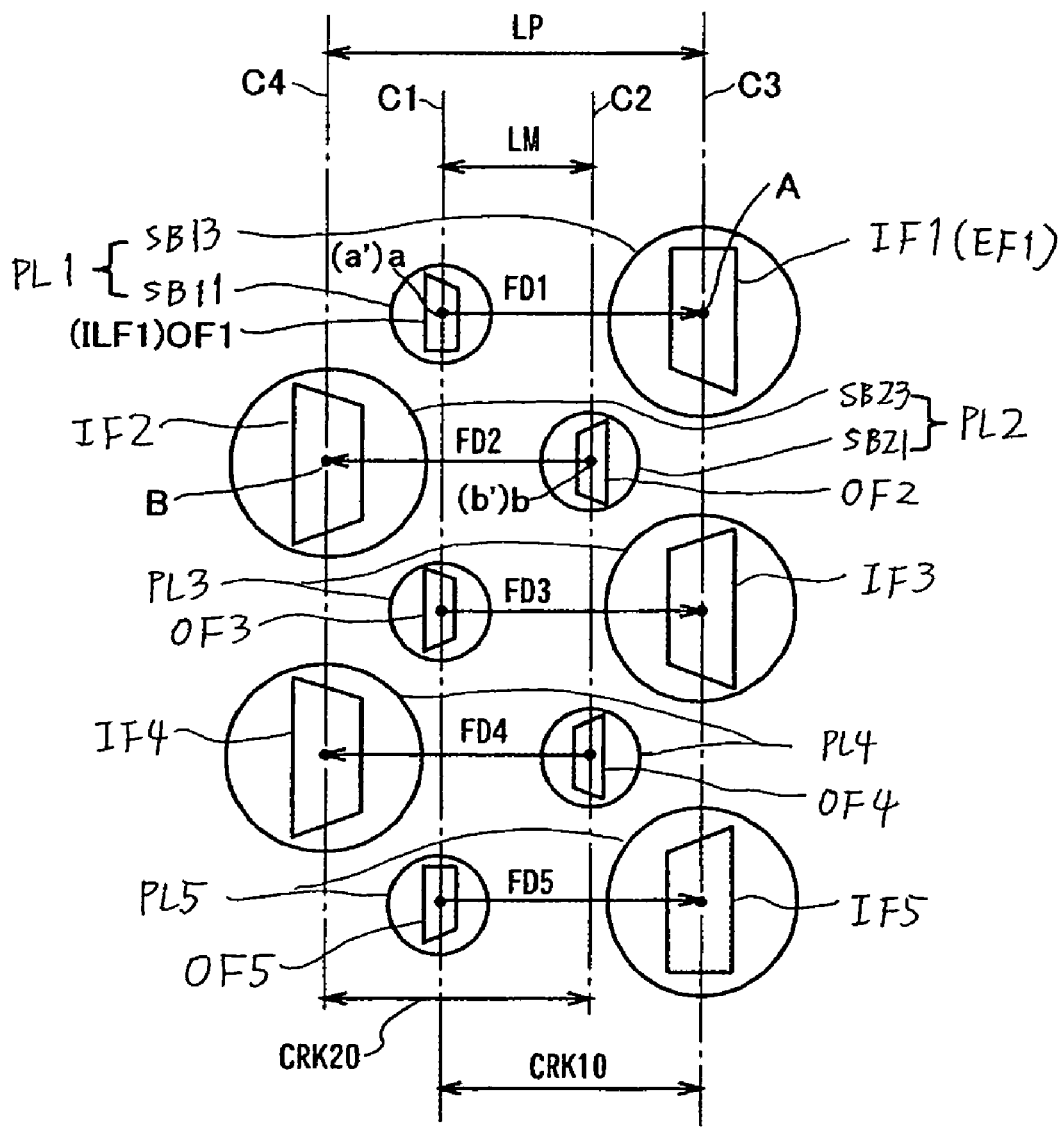
FIG. 3 is a diagram showing the relationship between viewing fields OF1 to OF5 and image fields IF1 to IF5 according to the first embodiment.
Figure 4:
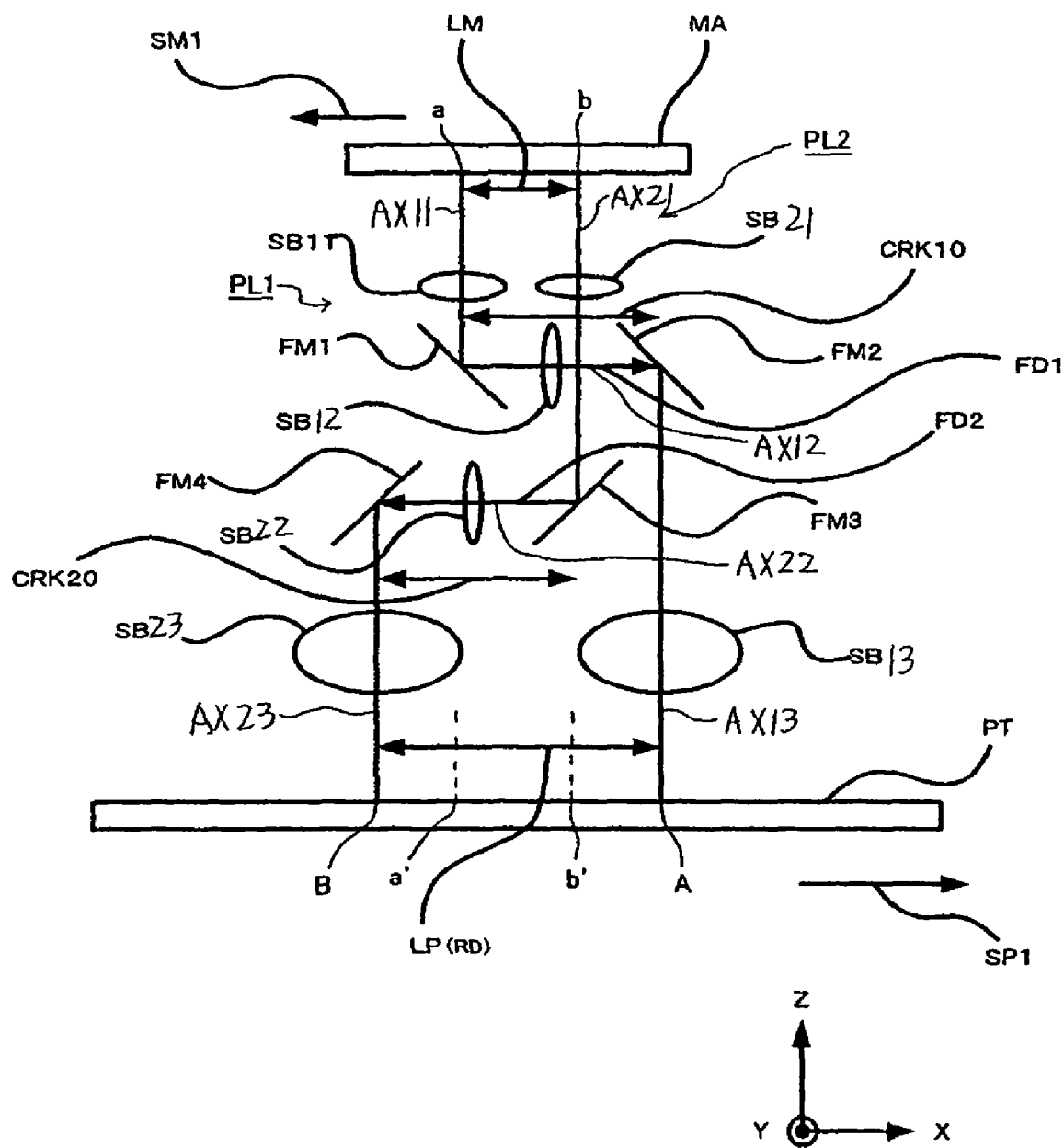
FIG. 4 is a diagram showing the structure of projection optical systems PL1 and PL2 shown in FIG. 2.

The structure and arrangement of the projection optical systems PL1 to PL5 forming the projection optical apparatus PL of the present embodiment will now be described in detail. The projection optical systems PL1, PL3, and PL5 in the first row have the same structure, and the projection optical systems PL2 and PL4 in the second row have the same structure. Thus, the structures of the first projection optical system PL1 and the second projection optical system PL2 will be mainly described. FIG. 3 is a plan view showing the relationship between the viewing fields OF1 to OF5 and the image fields IF1 to IF5 that are conjugate to the projection optical systems PL1 to PL5 shown in FIG. 1. FIG. 4 shows the projection optical systems PL1 and PL2 as viewed in the Y-direction.

In FIG. 3, a point (view point) that is included in the viewing field OF1 of the projection optical system PL1 and is on an optical axis AX11 (refer to FIG. 4) of the projection optical system PL1 is defined as point a, and a point (view point) that is included in the viewing field OF2 of the projection optical system PL2 and is on an optical axis AX21 (refer to FIG. 4) of the projection optical system PL2 is defined as point b. A point that is included in the image field IF1 of the projection optical system PL1 on the plate PT and is on an optical axis AX13 (refer to FIG. 4) of the projection optical system PL1 is defined as point A, and a point that is included in the image field IF2 of the projection optical system PL2 on the plate PT and is on an optical axis AX23 (refer to FIG. 4) of the projection optical system PL2 is defined as point B. The points A and B are conjugate to the points a and b with respect to the projection optical systems PL1 and PL2. For example, the points a and b may be the central points of the viewing fields OF1 and OF2. When, for example, the centers of the illumination fields defined in the viewing fields OF1 and OF2 are not on the optical axes, the points a and b may be the centers of the illumination fields or the like.

The points (including the point a) that are included in the viewing fields OF1, OF3, and OF5 of the projection optical systems PL1, PL3, and PL5 in the first row and are on the optical axes of the projection optical systems PL1, PL3, and PL5 are arranged on a straight line C1, which is parallel to the non-scanning direction (Y-direction). A straight line C2, which links the points (including the point b) that are included in the viewing fields OF2 and OF4 of the projection optical systems PL2 and PL4 in the second row and are on the optical axes of the projection optical systems PL2 and PL4, is parallel to the straight line C1, on which the point a is arranged and which is parallel to the Y-axis, and is distant from the straight line C1 by a predetermined distance LM. The distance LM may be regarded as the X-direction (or scanning-direction) distance between the points a and b included in the viewing fields of the projection optical systems PL1 and PL2 (hereafter may be referred to as the mask inter-field distance LM). The distance LM may also be regarded as the X-direction distance on the mask MA between the two projection optical systems PL1 and PL2.

The viewing fields OF1, OF3, and OF5 in the first row have the same trapezoidal shape of which two sides in the Y-direction are the oblique sides of the trapezoid (although the viewing fields OF1 and OF5 arranged at the two ends each have an inner side parallel to X-axis). The viewing fields OF2 and OF4 in the second row have the trapezoidal shape that is obtained through 180-degree rotation of the viewing field OF3. The shape of the viewing fields OF1 and OF5 is not limited to the trapezoidal shape. For example, the Y-direction end portions may be formed to be triangular in the Y-direction.

The projection optical systems PL1 to PL5 of the present embodiment each form an inverted image with the enlargement magnification M. Thus, the image fields IF1 to IF5 have trapezoidal shapes (180-degree rotated) obtained by magnifying the corresponding viewing fields OF1 to OF5 with the enlargement magnification M. As a result, the points (including the point A) included in the image fields IF1, IF3, and IF5 that are on the optical axes are arranged on a straight line C3, which is parallel to the non-scanning direction (Y-direction). A straight line C4, which links the points (including the point B) that are included in the image fields IF2 and IF4 of the projection optical systems PL2 and PL4 in the second row and are on the optical axes of the projection optical systems PL2 and PL4, is parallel to the straight line C3, on which the point A is arranged and which is parallel to the Y-axis, and is distant from the straight line C3 by a predetermined distance LP in the X-direction. The distance LP may be the X-direction distance between the points A and B included in the image fields, which are conjugate to the points a and b included in the viewing fields of the projection optical systems PL1 and PL2 (hereafter referred to as the plate inter-field distance LP). The distance LP may also be referred to as the X-direction distance on the plate PT between the two projection optical systems PL1 and PL2.

In the present embodiment, the optical axes of the projection optical systems PL1, PL3, and PL5 in the first row on the mask MA and the optical axes of the projection optical systems PL1, PL3, and PL5 on the plate PT are shifted from each other by a shift amount (transfer amount) CRK10 in a first deflection direction FD1, which is the +X direction. The optical axes of the projection optical systems PL2 and PL4 in the second row on the mask MA and the optical axes of the projection optical systems PL2 and PL4 on the plate PT are shifted from each other by a shift amount CRK20 in a second deflection direction FD2, which is the −X direction. More specifically, the first deflection direction FD1 and the second deflection direction FD2 are face opposite directions along the X-direction.

To shift the optical axes of the projection optical systems on the plate PT with respect to the optical axes of the projection optical systems on the mask MA, that is, to direct light coming from each view point to the conjugate point on the corresponding image field, which is shifted in the X-direction from each view point, the projection optical system PL1 (PL2) includes a first partial optical system SB11 (SB21), a second partial optical system SB12 (SB22), and a third partial optical system SB13 (SB23), which are arranged in the stated order as being nearer to the mask MA in FIG. 4. The first partial optical system SB11 has the optical axis AX11 (AX21), which is parallel to the Z-axis. The second partial optical system SB12 has the optical axis AX12 (AX22), which is parallel to the X-axis. The third partial optical system SB13 has the optical axis AX13 (AX23), which is parallel to the Z-axis. The three partial optical systems SB11, SB12, and SB13 of the first projection optical system PL1 and the three partial optical systems SB21, SB22, and SB23 of the second projection optical system PL2 form a one-time imaging optical system that forms an image (inverted image) of the pattern of the mask MA onto the plate PT with the enlargement magnification M. Although the imaging optical system shown in the example of FIG. 4 is separated in the three partial optical systems SB11, SB12, and SB13, the imaging optical system may have any structure and any arrangement. The imaging optical system is only required to form an inverted image of the pattern of the mask MA onto the plate PT. For example, an imaging optical system that forms an even number of intermediate images or a catadioptric system may be employed.

The projection optical system PL1 (PL2) includes a first mirror FM1 (FM3) and a second mirror FM2 (FM4). The first mirror FM1 deflects light beams from the first partial optical system SB11 (SB21) in the first deflection direction FD1 (second deflection direction FD2). The second mirror FM2 (FM4) deflects light beams from the second partial optical system SB12 (SB22) in the −Z direction. In this case, the mirrors FM1 and FM2 of the first projection optical system PL1, which are two deflection (folding) members (first light beam transfer member), transfer light beams from point a on the mask MA to the conjugate point A on the plate PT, which is shifted in the first deflection direction FD1 by the shift amount CRK10. The mirrors FM3 and FM4 of the second projection optical system PL2, which are two deflection members (second light beam transfer member), transfer light beams from the point b on the mask MA to the conjugate point B on the plate PT, which is at the position shifted in the second deflection direction FD2 by the shift amount CRK20.

When the light beams (optical axes) are shifted with the two deflection members, the degree of freedom in arranging the two deflection members on the optical paths of the projection optical systems PL1 and PL2 is significantly high. In this case, the projection optical systems PL1 and PL2 are easily formed. Instead of the mirrors, prisms may be used as the deflection members. Further, instead of using the two deflection members, three or more deflection members may be used to shift the light beams. The projection optical systems PL1 and PL2 are arranged at positions shifted from each other in the Y-direction. The projection optical system PL2 may be a 180-degree rotated projection optical system of the projection optical system PL1. In this case, the shift amount CRK10 and the shift amount CRK20 are the same but are in opposite directions.

Figure 5A:
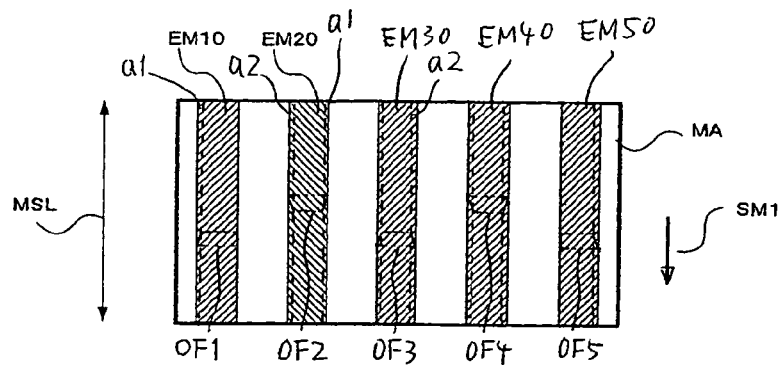
FIG. 5(A) is a plan view of a mask MA shown in FIG. 1

Referring back to FIG. 3, the image fields IF1 to IF5 of the five projection optical systems PL1 to PL5 of the present embodiment are arranged in a manner that the image fields IF1 to IF5 become continuous to one another in the Y-direction when the image fields IF1 to IF5 are moved relative to one another in the X-direction. However, the projection optical systems PL1 to PL5 project an image with an enlargement magnification. Thus, the viewing fields OF1 to OF5 of the projection optical systems PL1 to PL5 have predetermined gaps therebetween in the Y-direction. As shown in FIG. 5(A) and FIG. 1, five elongated pattern fields EM10, EM20, EM30, EM40, and EM50 having a length MSL are formed in the pattern formation fields of the mask MA. The pattern fields EM10, EM20, EM30, EM40, and EM50 are arranged at predetermined intervals in the X-direction. During exposure, the pattern fields EM10 to EM50, or specifically the viewing fields OF1 to OF5 of the projection optical systems PL1 to PL5, are scanned in a scanning direction SM1 (in −X direction in the example of FIG. 5(A)). An inverted image is formed on the plate PT in the present embodiment. Thus, the +Y direction end portion of the pattern field EM10 (or EM20 or the like) of the mask MA and the −Y direction end portion of the pattern field EM20 (or EM30 or the like), which is adjacent to the pattern field EM10 have the same pattern a1 (or a2 or the like) for overlap exposure.

Figure 5B:
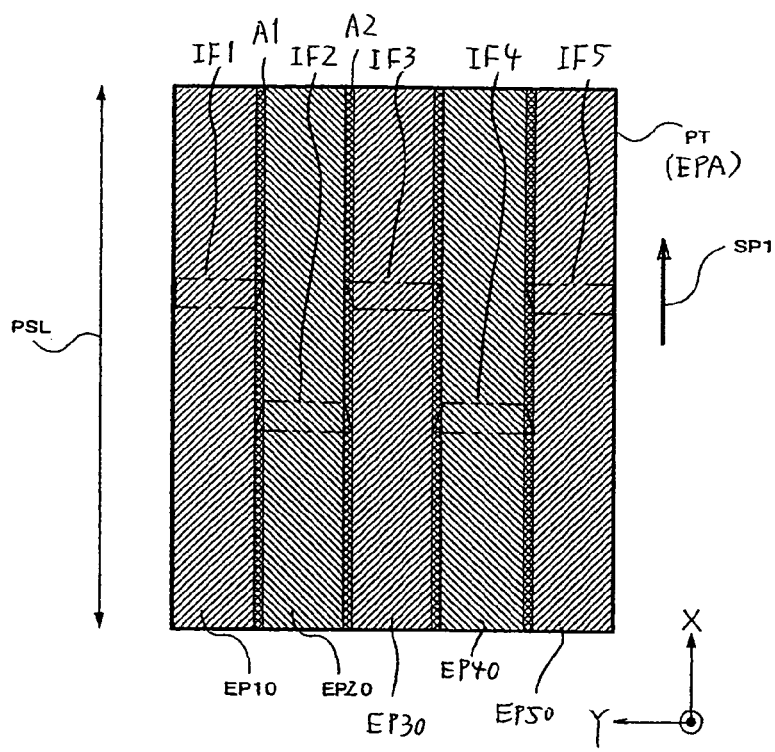
FIG. 5(B) is a plan view of a plate PT shown in FIG. 2.

As shown in FIG. 5(B) and FIG. 2, one of the pattern transfer fields on the plate PT corresponds to the five image fields IF1 to IF5, may be considered as five exposure fields EP10, EP20, EP30, EP40, and EP50, with boundary portions of adjacent exposure fields being virtually overlapped. Each exposure field has a length PSL in the X-direction.

FIG. 12 shows the positional relationship between the mask MA and the plate PT during exposure of the pattern of the mask MA in FIG. 5(A) onto the plate PT shown in FIG. 5(B). As shown in FIG. 12(A), the plate PT moves in the scanning direction SP1 (+X direction) in synchronization with the movement of the mask MA in the scanning direction SM1 (−X direction in this example). Then, illumination of the viewing fields OF2 and OF4 of the pattern fields EM20 and EM40 is started, and exposure of the image fields IF2 and IF4 of the plate PT starts being exposed. Afterwards, the mask MA is moved by the distance LM as shown in FIG. 12(B). Then, illumination of the viewing fields OF1, OF3, and OF5 with the pattern fields EM10, EM30, EM50 is started, and exposure of the image fields IF1, IF3, and IF5 of the plate PT starts being exposed. In this exposure, the image of the pattern fields EM10, EM30, and EM50 and the image of the pattern fields EM20 and EM40 are exposed at the same positions in the X-direction in a manner that these images are continuous to each other.

Figure 12A:
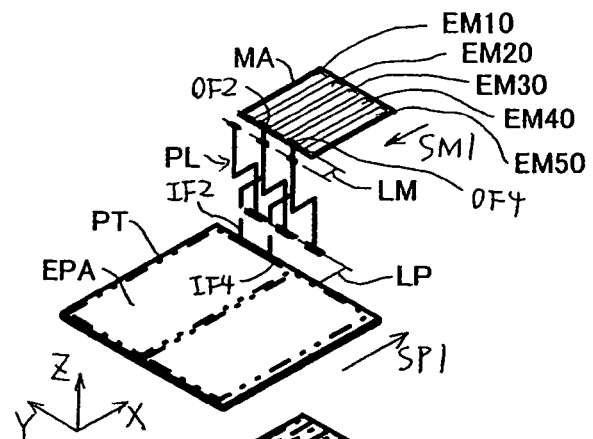
FIG. 12 is a diagram showing changes in the positional relationship between the mask MA and the plate PT during scanning exposure in the first embodiment.
Figure 12B:
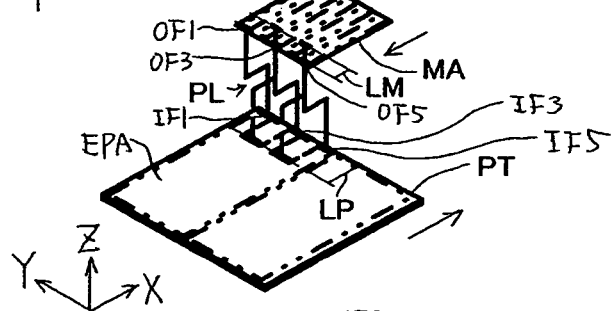
Figure 12C:
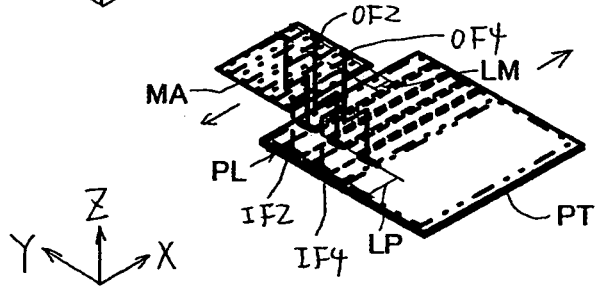
Figure 12D:
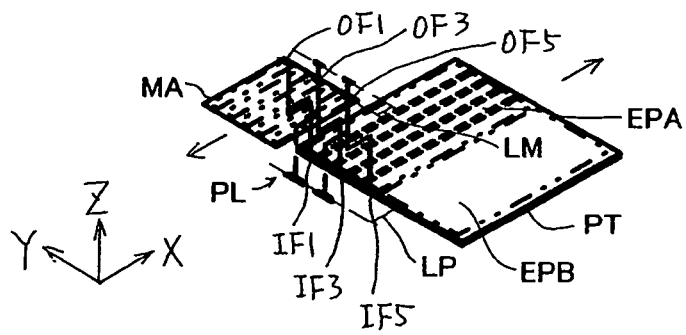

As shown in FIGS. 12(C) and 12(D), the plate PT is moved by the distance LP after the image fields IF2 and IF4 of the plate PT is exposed, and then the image fields IF1, IF3, and IF5 of the plate PT is exposed. As a result, inverted images of the patterns of the pattern fields EM10 to EM50 of the mask MA are exposed in the exposure fields EP10 to EP50 of the plate PT in a manner that these images are continuous to one another in the Y-direction. As shown in FIG. 5(B), the inverted images of the patterns a1 (or a2 or the like) at two positions on the mask MA overlap each other in a boundary portion A1 (or A2 or the like) of the adjacent two exposure fields EP10 and EP20 (or EP20 and EP30 or the like) on the plate PT. This reduces errors in the continuity of exposed images. As shown in FIG. 12(D), the scanning on the plate PT needs to be performed not only along the X-direction length PSL (the shortest scanning distance) of the pattern transfer field EPA on the plate PT but also along the distance LP between the two rows of image fields. The distance (plate inter-field distance) LP may also be referred to as an idling distance RD.

After the scanning shown in FIG. 12(D) is performed, the substrate stage is driven to move the plate PT in the +Y direction in a stepwise manner, and then the plate PT is scanned in −X direction using the enlargement magnification as a velocity ratio in synchronization with the scanning of the viewing fields OF1 to OF5 of the mask MA performed in the +X direction. As a result, magnified images of the pattern of the mask MA are exposed in the next pattern transfer field EPB on the plate PT in a manner that the images are continuous to one another.

As described above, the mask MA of the present embodiment shown in FIG. 5(A) has the pattern fields EM10 to EM50 arranged at the same positions in the X-direction. However, when the projection optical systems PL1 to PL5 do not have 1×1 magnification, the relationship between the X-direction distance (mask inter-field distance) LM between the points a and b included in the viewing fields of the projection optical systems PL1 and PL2 in FIG. 3 and the X-direction distance (plate inter-field distance) LP between the points A and B on the plate PT, which are conjugate to the points a and b, must be taken into consideration for exposure of continuous patterns. More specifically, to actually expose the patterns in the exposure fields EP10 to EP50 onto the plate PT in a manner that the images will be continuous to each other in the Y-direction, a predetermined offset MO (hereafter referred to as a mask offset) MO must be set between the positions of the odd-numbered pattern fields EM10, EM30, and EM50, which are illuminated by the first-row projection optical systems PL1, PL3, and PL5 shown in FIG. 1, and the positions of the even-numbered pattern fields EM20 and EM40, which are illuminated by the second-row projection optical systems PL2 and PL4 shown in FIG. 1.

FIG. 13 shows the exposure performed on the mask MA having the mask offset MO. As shown in FIG. 13(A), the distance LP is smaller than the distance LM. Thus, the mask MA has the predetermined mask offset MO in the X-direction between the odd-numbered pattern field EM10 or the like and the even-numbered pattern field EM20 or the like on the mask MA as shown in FIG. 13(C). In this case, the mask MA is scanned in −X direction and the viewing fields OF2 and OF4 of the pattern fields EM20 and EM40 start being illuminated as shown in FIG. 13(A), and then the plate PT starts being exposed. Afterwards, when the viewing fields OF1, OF3, and OF5 of the pattern fields EM10, EM30, and EM50 starts being illuminated as shown in FIG. 13(B), an image of the pattern field EM10, EM30, and EM50 and an image of the pattern field EM20 and EM40 are exposed at the same positions on the plate PT in the X-direction.

Figure 13A:
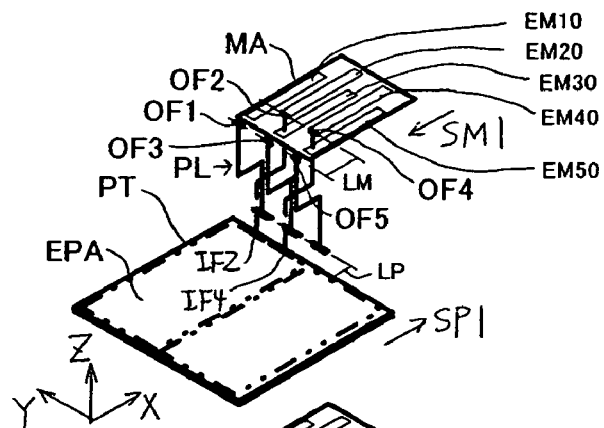
FIG. 13 is a diagram showing changes in the positional relationship between the mask MA having a predetermined mask offset MO and the plate PT during scanning exposure.
Figure 13B:
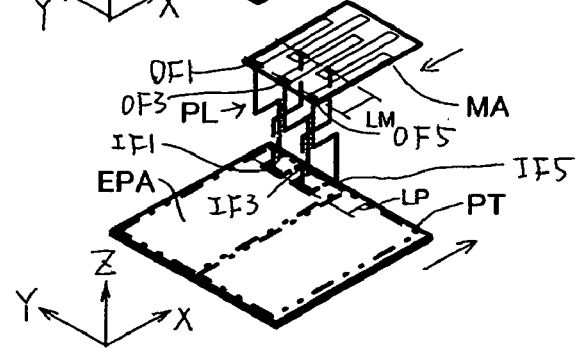
Figure 13C:
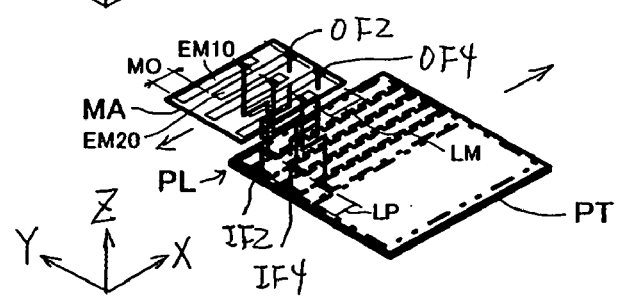
Figure 13D:
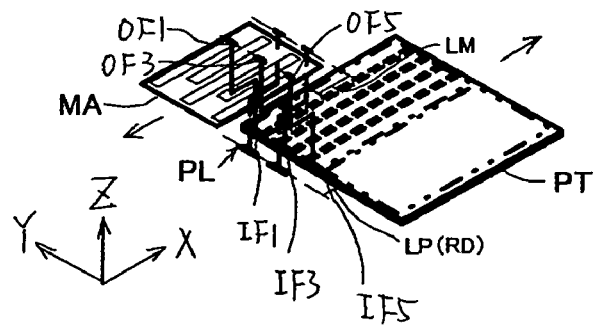

As shown in FIGS. 13(C) and 13(D), the plate PT moves by the distance LP after the image field IF2 and IF4 of the plate PT is exposed, and then the image field IF1, IF3, and IF5 of the plate PT is exposed. This completes the scanning exposure of the plate PT. In this case, the idling distance RD (distance LP) of the plate PT is shorter than that in the scanning exposure shown in FIG. 12. In other words, the mask offset MO is substantially inversely proportional to the idling distance RD. When the idling distance RD is set lengthened, the mask offset MO is shortened. In this case, the pattern of the mask MA can be downsized in the scanning direction and the mask stage MSTG can be downsized in the scanning direction. Further, the pattern of the mask MA can be formed with a higher precision. When the mask offset MO is lengthened, the idling distance RD is shortened. In this case, the base member of the substrate stage PSTG can be downsized in the scanning direction, and the time required for a single scanning exposure can be shortened. In this case, the throughput of the exposure process is improved. By balancing the mask offset MO and the idling distance RD in accordance with the application (for example, micropattern or rough pattern) of the projection exposure apparatus, the cost performance of the projection exposure apparatus is improved.

In the present embodiment, the mask offset MO and the idling distance RD are well-balanced by setting predetermined conditions between the distance (mask inter-field distance) LM and the distance (plate inter-field distance) LP.

More specifically, the shift amount CRK10 of the light beams (optical axis) of the projection optical system PL1 is a lengthwise element of a line segment a'A (first line segment) in FIG. 4. The line segment a A links a point a', which is obtained by projecting (orthogonally projecting) the point a included in the viewing field of the projection optical system PL1 onto the plate PT in a manner parallel to Z-axis, and the point A on the plate PT, which is conjugate to the point a. In the same manner, the shift amount CRK20 of the light beam (optical axis) of the projection optical system PL2 is a lengthwise element of a line segment b'B (second line segment). The line segment b'B links a point b', which is obtained by projecting (orthogonally projecting) the point b included in the viewing field of the projection optical system PL2 onto the plate PT in a manner parallel to Z-axis, and the point B on the plate PT, which is conjugate to the point b.

As one example, the line segment a'A and the line segment b'B at least partially overlap each other when viewed in the Y-direction (non-scanning direction) in the present embodiment. When this is associated with the arrangement of the first-row projection optical systems PL1, PL3, and PL5 and the second-row projection optical systems PL2 and PL4 shown in FIG. 3, the straight line C1 (first row) that extends on the optical axes of the first-row viewing fields OF1, OF3, and OF5 is between the straight line C2 (second row) and the straight line C4 (fourth row) with respect to the X-direction (scanning direction) when viewed in the Z-direction. The straight line C2 extends on the optical axes of the second-row viewing fields OF2 and OF4. The straight line C4 extends on the optical axes of the viewing fields IF2 and IF4 that are conjugate to the viewing fields OF2 and OF4. The straight line C2 of the second row is between the straight line C1 of the first row and the straight line C3 (third row) with respect to the X-direction (scanning direction). The straight line 3C extends on the optical axes of the image fields IF1, IF3, and IF5, which are conjugate to the viewing fields arranged along the straight line C1.

Due to such an arrangement, exposure is easily performed in an optimum manner while the exposure fields EP10 and EP20 on the plate PT (or the exposure fields EP10 to EP50) are continuous to one another in the Y-direction as shown in FIG. 5(B). Further, the distance LP is relatively short (the idling distance RD is relatively short), but is longer than the overlapped portions (in other words, the mask offset MO is relatively short). In this case, the mask offset MO and the idling distance RD are easily optimized in a well-balanced manner. The mask offset MO may be set smaller or the idling distance RD may be set shorter when necessary by adjusting the distance LP and the distance LM within the range in which the mask offset MO and the idling distance RD are well-balanced.

The line segment a'A and the line segment b'B at least partially overlap each other as viewed in the Y-direction (or the straight line C1 is between the straight lines C2 and C4 and the straight line C2 is between the straight lines C1 and C3). This indicates that the light beams of the projection optical system PL1 and the light beams of the projection optical system PL2 (or the first-row projection optical systems PL1, PL3, and PL5 and the second-row projection optical systems PL2 and PL4) are transferred in the directions opposite to each other. This also indicates that the projection optical system PL1 (or PL1, PL3, and PL5) and the projection optical system PL2 (or PL2 and PL4) partially overlap each other as viewed in the Y-direction, or in other words, the projection optical systems PL1 and PL2 (or the projection optical systems PL1 to PL5) are in a nested arrangement. This arrangement reduces the entire size of the projection optical apparatus PL, and also reduces image oscillation, which may occur when the apparatus is subjected to disturbance such as vibration. As a result, the mask pattern is transferred onto the plate PT with a high precision.

In the present embodiment, the line segment a'A and the line segment b'B are both parallel to the X-direction. In this case, the projection optical systems PL1 and PL2 are simply required to transfer light beams in the X-direction using light beam transfer members. This simplifies the structure of the optical systems.

The relationship between the mask offset MO and the idling distance RD will now be described in a more precise manner. Referring now to FIG. 4, the X-direction distance (mask inter-field distance) LM between the points a and b included in the viewing fields of the projection optical systems PL1 and PL2 on the mask MA and the X-direction distance (plate inter-field distance) LP between the points A and B on the plate PT, which are conjugate to the points a and b, and the shift amounts CRK10 and CRK20 of the light beams of the projection optical systems PL1 and PL2 have the relationship written as expression (1) below. The distances LP and LM are assumed to have a positive sign the direction from the points B and b to the points A and a is the +X direction. The shift amounts CRK10 and CRK20 have a positive sign when the direction from the points a' and b' to the points A and B is the +X direction.

$$LP = CRK10 - CRK20 + LM \quad (1)$$

In the present embodiment, the distance LP is set within the range written as expression (2) below using the enlargement magnification M (of a negative value) of the projection optical systems PL1 and PL2.

$$0 \leq |LP| \leq |M*LM| \quad (2)$$

The distance LP is a positive value, the distance LM is a negative value, and the enlargement magnification M is a negative value in the example of FIG. 4. In this case, expression (2) may also be written as expression (2A) below. Expression (2A) will be hereafter used instead of expression (2).

$$0 \leq LP \leq M*LM \quad (2A)$$

As shown in FIGS. 5(A) and 5(B), the scanning-direction length MSL of the pattern fields EM10 to EM50 of the mask MA (when the mask MA does not have the mask offset MO) and the scanning-direction length PSL of the exposure fields EP10 to EP50 of the plate PT have the relationship written as expression (3).

$$PSL = MSL*|M| \quad (3)$$

The mask offset MO shown in FIG. 13(C) is written as expression (4) below.

$$MO = LP/M - LM \quad (4)$$

The idling distance RD of the substrate stage PSTG described above is equal to the distance LP, which is written as expression (5) below.

$$RD = LP \quad (5)$$

Expression (4) is transformed into expression (6) below.

$$RD = M*MO + M*LM \quad (6)$$

Figure 6:
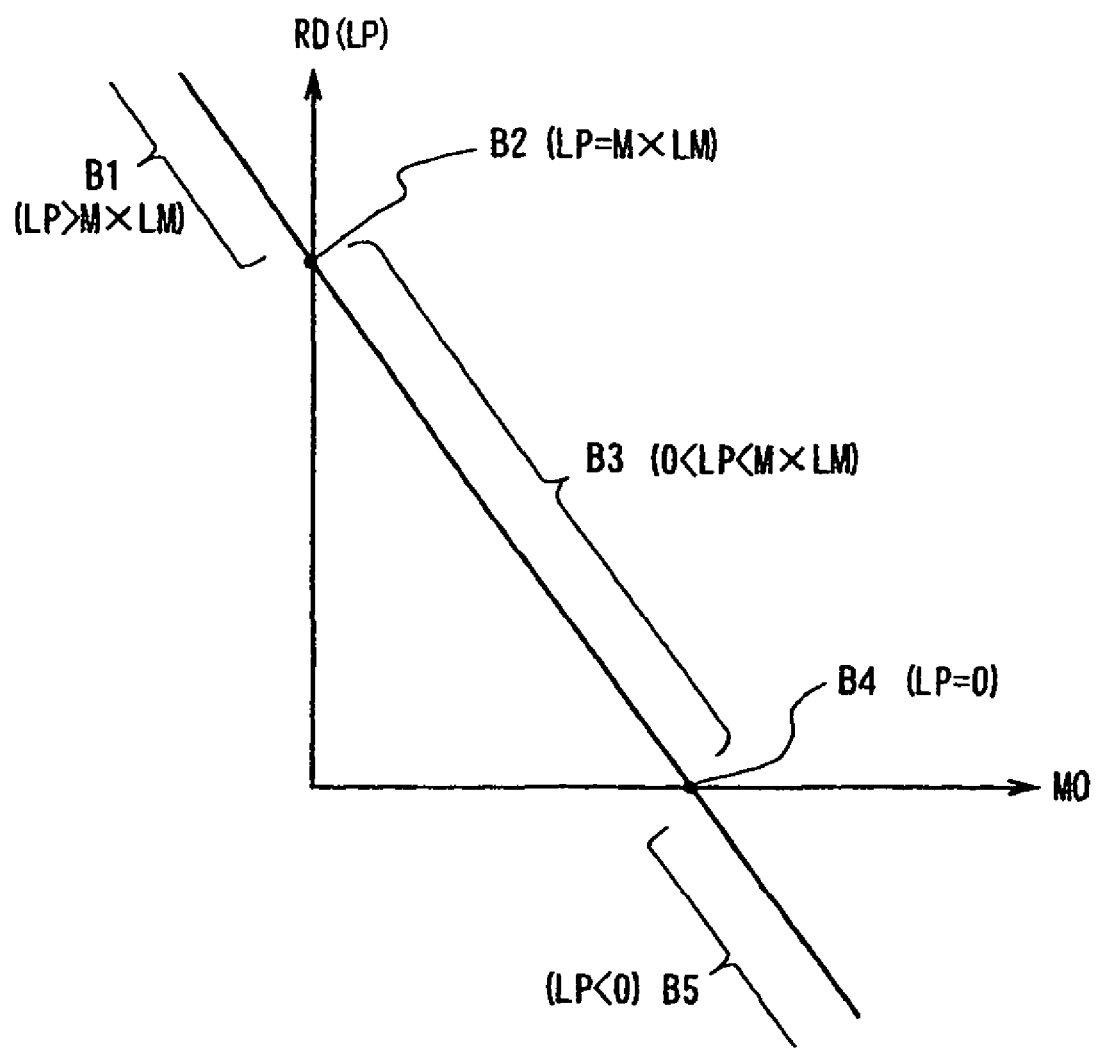
FIG. 6 is a chart showing the relationship between a mask offset MO and an idling distance RD in the first embodiment.

In the present embodiment, the enlargement magnification M has a negative sign. When the distance LM is a negative value, the idling distance RD and the mask offset MO that satisfy expression (6) will have the relationship shown in FIG. 6. In FIG. 6, the idling distance RD and the mask offset MO are inversely proportional to each other within the range in which expression (2A) is satisfied (including the point B2, the range B3, and the point B4). In this range, the idling distance RD and the mask offset MO fall within their predetermined ranges and the idling distance RD and the mask offset MO are well-balanced.

At the point B2 at which expression (7) below is satisfied (the upper limit value of expression (2A)), the mask offset MO is zero and the idling distance RD is the distance LP (=M*LM).

$$LP = M*LM \quad (7)$$

Within the range B1 (LP>M*LM) in which the distance LP exceeds the upper limit value of expression (2A), the mask offset MO again needs to be set and the idling distance RD increases.

At the point B4 (LP=0) shown in FIG. 6 at which the distance LP is the lower limit value of expression (2A), the idling distance RD is zero but the mask offset MO is the distance LM (more accurately, −LM). Within the range B5 (LP<0) in which the distance LP exceeds the lower limit value of expression (2A), the idling distance RD again needs to be set and the mask offset MO further increases.

Figure 7:
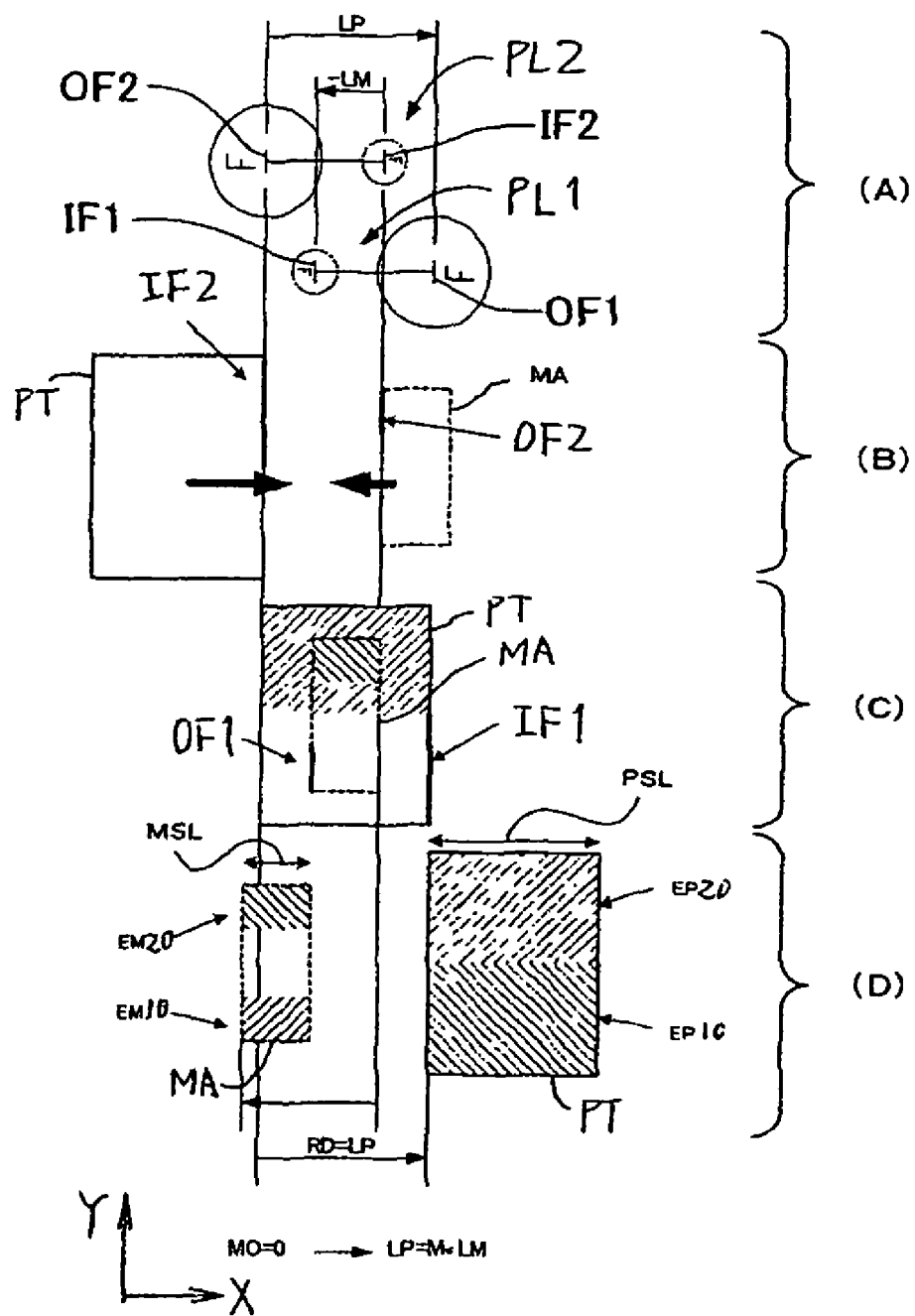
FIG. 7 is a diagram showing one example of scanning exposure performed at point B2 in FIG. 6.
Figure 8:
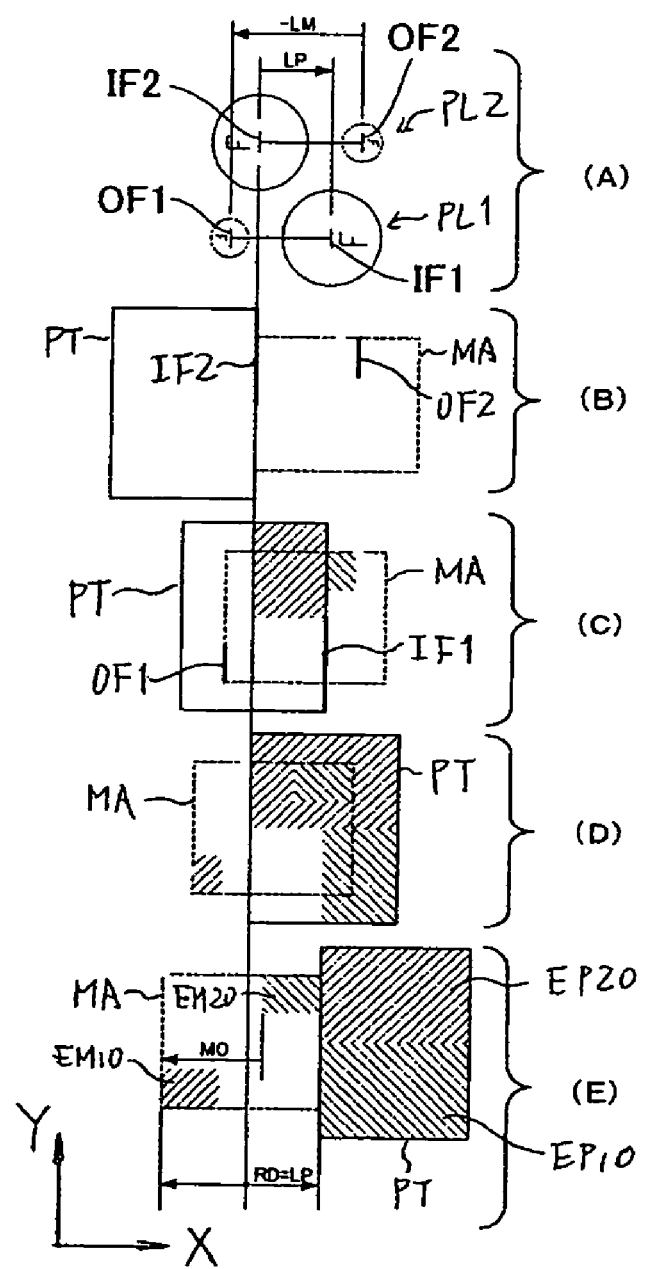
FIG. 8 is a diagram showing one example of scanning exposure performed in range 3 in FIG. 6.
Figure 9:
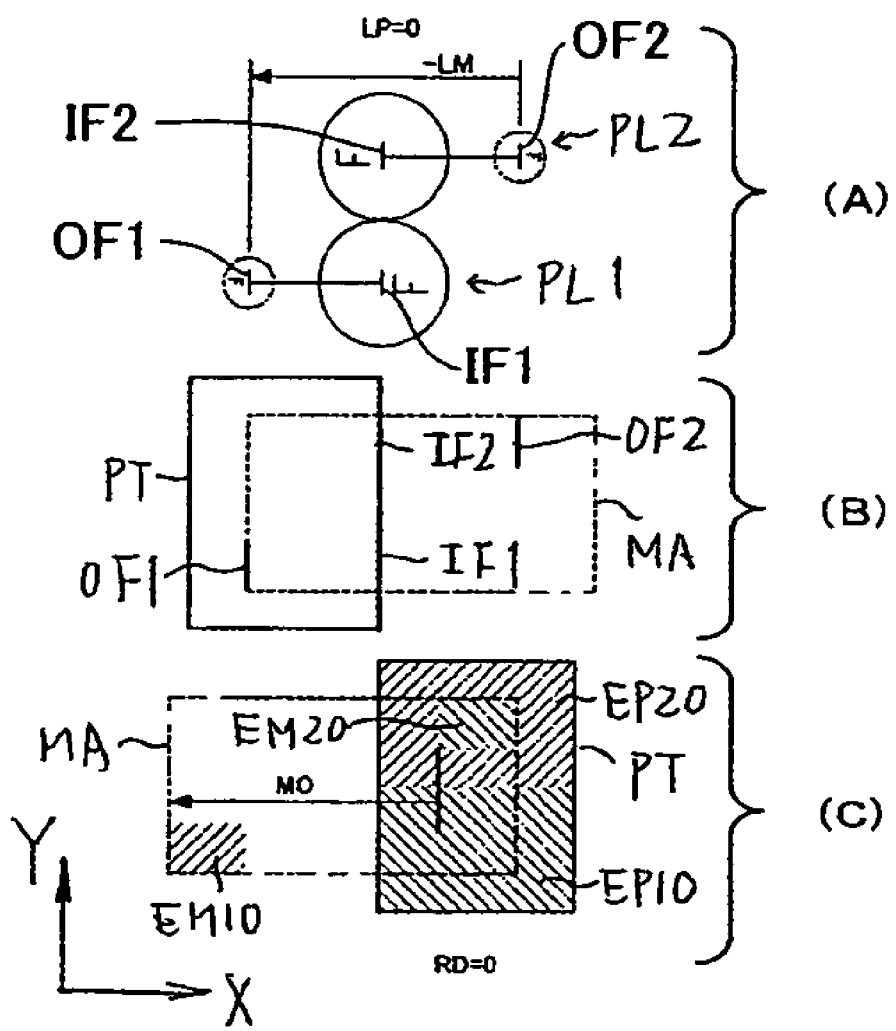
FIG. 9 is a diagram showing one example of scanning exposure performed at point B4 in FIG. 6.
Figure 10:
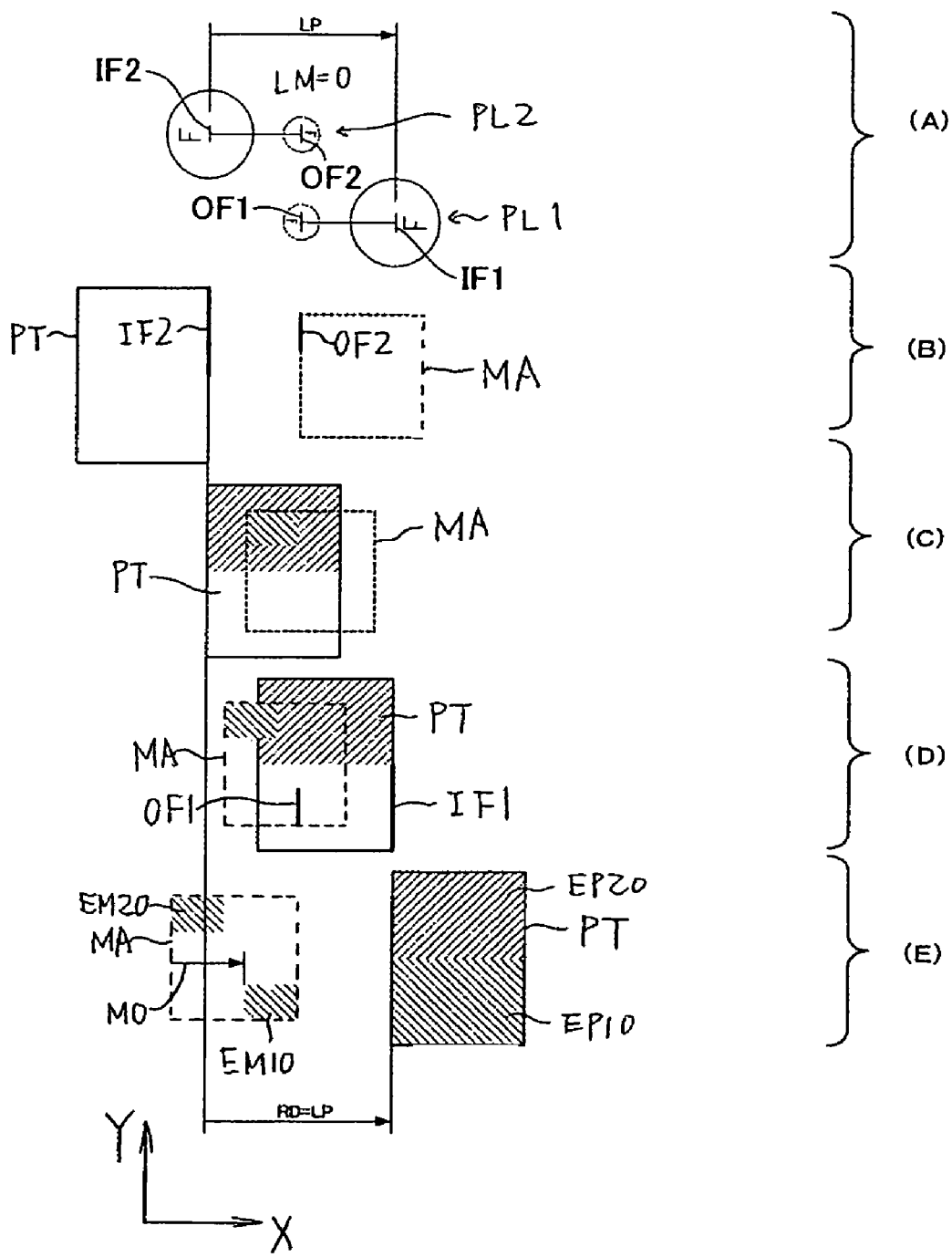
FIG. 10 is a diagram showing one example of scanning exposure performed in range B1 in FIG. 6.

FIG. 7 shows the scanning exposure performed when the distance LP exceeds the upper limit value of expression (2A) (point B2 in FIG. 6). FIG. 8 shows the scanning exposure performed when the distance LP is within the range of the conditional expression (range B3 in FIG. 6). FIG. 9 shows the scanning exposure performed when the distance LP is the lower limit value (point B4 in FIG. 6). FIG. 10 shows the scanning exposure performed when the distance LP far exceeds the upper limit value (range B1 in FIG. 6). In FIGS. 7 to 10, the mask MA is scanned in the −X direction and the plate PT is scanned in the +X direction using the absolute value of the enlargement magnification M for the projection optical systems PL1 and PL2 as the velocity ratio. For the sake of brevity, the projection optical system PL1 (pattern field EM10) and the projection optical system PL2 (pattern field EM20) are switched in the Y-direction and the distance LM is expressed as −LM.

FIGS. 7(A), 8(A), 9(A), and 10(A) are plan views showing the relationship between the viewing fields OF1 and OF2 and the image fields IF2 and IF2 of the projection optical systems PL1 and PL2. FIGS. 7(B), 8(B), 9(B), and 10(B) are plan views showing the state in which the scanning exposure operation is started, or more specifically, the state in which the viewing field OF2 of the mask MA starts being illuminated and the image field IF2 of the plate PT starts being exposed. In FIG. 9(B), the image fields IF1 and IF2 are arranged in the Y-direction. This simultaneously starts illumination of the viewing field OF1 with the mask MA and exposure of the plate PT with the image field IF1.

FIG. 10(C) shows a state in which the viewing field OF2 of the mask MA has been completely illuminated and the image field IF2 of the plate PT has been completely exposed. FIGS. 7(C), 8(C), and 10(D) are plan views showing a state in which illumination of the viewing field OF1 of the mask MA is started, and exposure of the image field IF1 of the plate PT is started. FIG. 8(D) shows a state in which the viewing field OF2 of the mask MA has been completely illuminated and the image field IF2 of the plate PT has been completely exposed. FIGS. 7(D), 8(E), 9(B), and 10(E) are plan views showing a state in which the scanning exposure operation has been completed, that is, the viewing field OF1 of the mask MA has been completely illuminated and the image field IF1 of the plate PT has been completely exposed.

It is apparent from FIG. 7(D) that the mask offset MO is not generated between the pattern fields EM10 and EM20 of the mask MA when the distance LP is the upper limit value (M*LM). Thus, the mask stage MSTG can be downsized. The scanning exposure operation shown in FIGS. 12(A) to 12(D) described above corresponds to the scanning exposure shown in FIG. 7.

As shown in FIG. 8(E), the mask offset MO is generated between the pattern fields EM10 and EM20 of the mask MA when the distance LP is within the above range. However, the idling distance RD of the plate PT is short in this case. Thus, the base member of the substrate stage PSTG can be downsized and the exposure throughput can be improved. It is an imperative of the present embodiment that the projection optical apparatus has an enlargement magnification. Thus, the mask stage MSTG having a small pattern does not determine the stage movement velocity. The substrate stage PSTG on which a magnified image is projected determines the stage movement velocity. Accordingly, the shortening of the idling distance RD of the substrate stage PSTG will improve the exposure throughput. The scanning exposure operation shown in FIGS. 13(A) to 13(D) corresponds to the scanning exposure shown in FIG. 8.

As shown in FIG. 9(C), the mask offset MO is generated between the pattern fields EM10 and EM20 of the mask MA when the distance LP is the lower limit value (or RD=LP=0). However, the idling distance RD of the plate PT can be reduced to zero in this case. The exposure throughput is improved most effectively in this case.

As shown in FIG. 10(D), the mask offset MO is generated between the pattern fields EM10 and EM20 of the mask MA when the distance LP far exceeds the upper limit value of the conditional expression (or LP>>M*LM). The mask cannot be downsized in this case. The idling distance RD of the plate PT is also lengthened, and the exposure throughput cannot be improved.

The effect of the present embodiment for downsizing the mask will now be described with reference to FIG. 11. FIG. 11(A) shows the positional relationship among a mask MA, a plate PT, and seven projection optical systems PLA1 to PLA7 included in the conventional multiple projection optical system of the equal magnification type. Each of the projection optical systems PLE1 to PLE7 shown in FIG. 11(A) has a lateral magnification of +1 in the scanning direction (X-direction) and a lateral magnification of +1 in the non-scanning direction (Y-direction).

FIG. 11(B) shows the positional relationship among the mask MA, the plate PT, and the projection optical systems PL1 to PL5 that are in a nested arrangement according to the present embodiment. In the arrangement shown in FIG. 11(B), the mask inter-field distance LM and the plate inter-field distance LP satisfy LM*M=LP, where M is the enlargement magnification of the projection optical systems PL1 to PL5. In the arrangement shown in FIG. 11(B), the projection optical systems have an enlargement magnification unlike the projection optical systems in the arrangement shown in FIG. 11(A). Thus, the arrangement in FIG. 11(B) enables the mask pattern to be downsized. This enables the mask stage to be downsized significantly and reduces errors (writing errors etc.) of the mask pattern. The nested arrangement of the projection optical systems PL1 to PL5 in FIG. 11(B) downsizes the entire projection optical apparatus as compared with when, for example, the projection optical systems PL1 to PL5 are not in the nested arrangement (when the projection optical systems PL1 and PL2 viewed in the Y-direction do not overlap each other). Each of the projection optical systems PL1 to PL5 in FIG. 11(B) has a negative lateral magnification in the scanning direction (M<−1) and a negative lateral magnification in the non-scanning direction (M<−1). Alternatively, each of the projection optical systems PL1 to PL5 may have a positive lateral magnification in the non-scanning direction (M>1). Such a modification of the present embodiment will be described later.

FIG. 11(C) shows the arrangement in which the viewing fields of the projection optical systems PL1 to PL5 are arranged more densely in the non-scanning direction than in the arrangement shown in FIG. 11(B). More specifically, in the projection optical systems PL1 to PL5 shown in FIG. 11(C) excluding the projection optical system PL3 arranged in the middle, the central position of the viewing field in the non-scanning direction and the central position of the viewing field in the non-scanning direction are shifted from each other. This arrangement enables the mask to be downsized in the non-scanning direction.

Although the projection optical apparatus PL of the present embodiment shown in FIG. 1 includes the five projection optical systems PL1 to PL5, the projection optical apparatus PL is only required to include at least two projection optical systems (partial projection optical systems), for example the projection optical systems PL1 and PL2.

Second Embodiment

A second embodiment of the present invention will now be described with reference to FIGS. 14 to 20. A stage system of a scanning projection exposure apparatus according to the second embodiment is similar to the stage system described in the first embodiment. However, a projection exposure apparatus of the second embodiment differs from the projection optical apparatus PL of the first embodiment shown in FIG. 2 in the shift direction and the shift amount of light beams (optical axes) of each of its projection optical systems PL1 to PL5. The components shown in FIGS. 14 to 20 corresponding to the components shown in FIGS. 1 to 5 are given the same reference numerals and will not be described in detail.

FIGS. 14(A) to 14(C) show a projection optical apparatus PLA of the second embodiment. FIG. 14(A) is a plan view showing the arrangement of a plurality of pattern fields EM10 to EM50 formed on a mask MA. FIG. 14(B) is a projection view showing the arrangement of the plurality of projection optical systems PL1 to PL5. FIG. 14(C) is a plan view showing the arrangement of a plurality of exposure fields EP10 to EP50 formed on a plate PT.

The projection optical apparatus PLA shown FIG. 14 differs from the projection optical apparatus shown in FIG. 3 (first embodiment) in that the viewing fields of projection optical systems PL1 to PL5 are arranged densely in a direction intersecting with a scanning direction (X-direction). The projection optical apparatus PLA shown in FIG. 14(B) includes the five projection optical systems PL1 to PL5, each of which includes first partial optical systems SB11 to SB51, second partial optical systems (not shown), third partial optical systems SB13 to SB52, and two deflection members (not shown).

The viewing field of the first projection optical system PL1 is aligned with the pattern field EM10 on the mask MA in a non-scanning direction (Y-direction). Light from the pattern field EM10 is directed in the first deflection direction FD1 by a first deflection member (not shown) via the first partial optical system SB11 of the first projection optical system PL1 and then passes through the third partial optical system SB13 via the second partial optical system (not shown) and a second deflection member (not shown). The light that has passed through the third partial optical system SB13 reaches part of the exposure field EP10 on the plate PT.

In the same manner, the viewing fields of the second to fifth projection optical system PL2 to PL5 are respectively aligned with the pattern fields EM20 to EM50 in the non-scanning direction. Light from the pattern fields EM20 to EM50 is directed in second to fifth deflection directions FD2 to FD5 by the first deflection member (not shown) via the first partial optical systems SB21 to SB51 of the second to fifth projection optical systems PL2 to PL5 and then passes through the third partial optical systems SB23 to SB53 via the second partial optical systems (not shown) and the second deflection member (not shown). The light that has passed through the third partial optical systems SB23 to SB53 reach parts of the exposure fields EP20 to EP50 on the plate PT.

The third deflection direction FD3 of the third projection optical system PL3, which is in the middle in the non-scanning direction, coincides with the scanning direction. The second and fourth deflection directions FD2 and FD4 of the second and fourth projection optical systems PL2 and PL4, which are adjacent to the third projection optical system PL3 in the non-scanning direction, are tilted in the non-scanning direction. The first and fifth deflection directions FD1 and FD5 of the first and fifth projection optical systems PL1 and PL5, which are outward from the second and fourth projection optical systems PL2 and PL4 in the non-scanning direction, are tilted more in the non-scanning direction than the second and fourth deflection directions FD2 and FD4.

In other words, the third deflection direction FD3 only has a vector component along the scanning direction. The second and fourth deflection directions FD2 and FD4 have vector components along the scanning direction and the non-scanning direction. The first and fifth deflection directions FD1 and FD5 have vector components along the scanning direction and the non-scanning direction, which are greater than the scanning direction vector components of the second and fourth deflection directions FD2 and FD4.

More specifically, the projection optical systems PL1 to PL5 shown in FIG. 14(B) are arranged in the same manner as in the arrangement shown in FIG. 3 (first embodiment) at the side of the plate PT but are arranged more densely in the non-scanning direction at the side of the mask MA. This arrangement enables the mask to be downsized also in the direction intersecting with the scanning direction.

The arrangement of the present embodiment shown in FIG. 14 also satisfies the conditional expressions (1) and (2A) described in the first embodiment in terms of the X-direction component of the distance between the first and second deflection members. In particular, the arrangement shown in FIG. 14(B) satisfies LP=M*LM.

In the arrangement shown in FIG. 14(B), a straight line C1, which extends through the viewing fields of the first-row projection optical systems PL1, PL2, and PL3 on the optical axes of the projection optical systems PL1, PL2, and PL3, is arranged between a straight line C2, which extends through the viewing fields of the second-row projection optical systems PL2 and PL4 on the optical axes of the optical systems PL2 and PL4, and a straight line C4, which extends through the image fields conjugate to the viewing fields of the projection optical systems PL2 and PL4 on the optical axes of the projection optical systems PL2 and PL4. The straight line C2 is arranged between the straight line C1 and a straight line C3, which extends through the image fields conjugate to the viewing fields arranged along the straight line C1. This nested arrangement downsizes the projection optical apparatus PLA.

In the above embodiment, the projection optical apparatus is an off-axis projection optical apparatus that formed by a plurality of off-axis projection optical systems (PL1 to PL5 etc.), of which viewing fields and image fields extend on the optical axes of the projection optical systems. Alternatively, the projection optical apparatus may be an on-axis projection optical apparatus that is formed by on-axis projection optical systems, of which viewing fields and image fields are shifted from the optical axes of the projection optical systems.

Figure 15A:
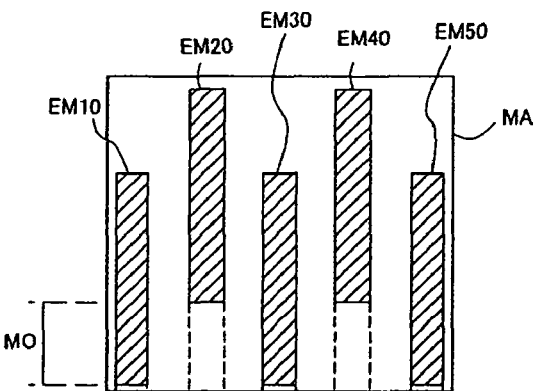
FIG. 15 is a diagram showing an on-axis projection optical system PLB that can be used when a mask has the mask offset MO and also shows the positional relationship between the mask and the plate.
Figure 15B:
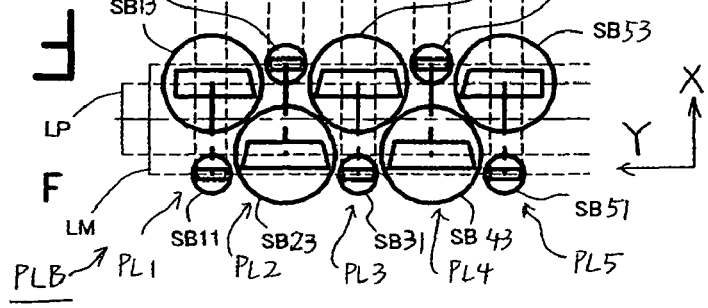
Figure 15C:
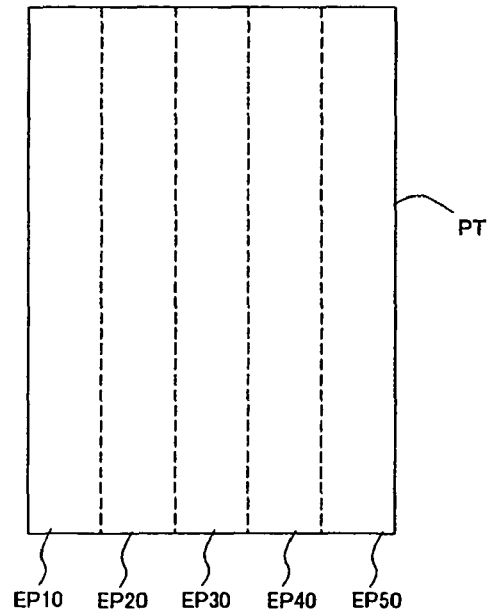

For comparison purpose, FIGS. 15(A) to 15(C) show an on-axis projection optical apparatus PLB, which can be used when a mask MA has a mask offset MO as shown in FIGS. 8(A) to 8(E). The projection optical apparatus PLB shown in FIG. 15(B) includes five on-axis projection optical systems PL1 to PL5, of which optical axes extend along the centers of their viewing fields and image fields. Images of patterns of pattern fields EM10 to EM50, which are formed on the mask MA having the mask offset MO shown in FIG. 15(A), are projected onto exposure fields EP10 to EP50, which are formed on a plate PT shown in FIG. 15(C), via the projection optical systems PL1 to PL5.

FIGS. 16(A) and 16(B) show the same projection optical apparatus PLB as shown in FIGS. 15(A) to 15(C). FIGS. 16(C) and 16(D) show an off-axis projection optical apparatus PLC that can be used when a mask MA has the same mask offset MO as the projection optical apparatus PLB. More specifically, the projection optical apparatus PLC shown in FIG. 16(A) includes five projection optical systems PL1 to PL5 in which the centers of their viewing fields and image fields are shifted from their optical axes in the X-direction. However, the projection optical apparatus PLC has the same function for projecting patterns of the mask MA onto the plate PT as the projection optical apparatus PLB shown in FIG. 16(A).

In the projection optical apparatus PLC shown in FIG. 16(C), the image fields of the projection optical systems PL1 to PL5 are set to be shifted more toward the corresponding viewing fields in the scanning direction (X-direction) as compared with the projection optical apparatus PLB shown in FIG. 16(A) (FIG. 15(B)). In this case, the distance (plate inter-field distance) LP between the image fields in the scanning direction is shorter than that in the projection optical apparatus shown in FIG. 16(A). Thus, the projection optical apparatus PLC further shortens the idling distance RD. As a result, the projection optical apparatus PLC achieves a higher exposure throughput than the projection optical apparatus shown in FIG. 16(A).

Although the above embodiments describe a case in which the plurality of projection optical systems (PL1 to PL5 etc.) are one-time imaging dioptric systems (optical systems that do not form intermediate images), the projection optical systems is not limited to one-time imaging optical systems and also not to dioptric systems.

Figure 17:
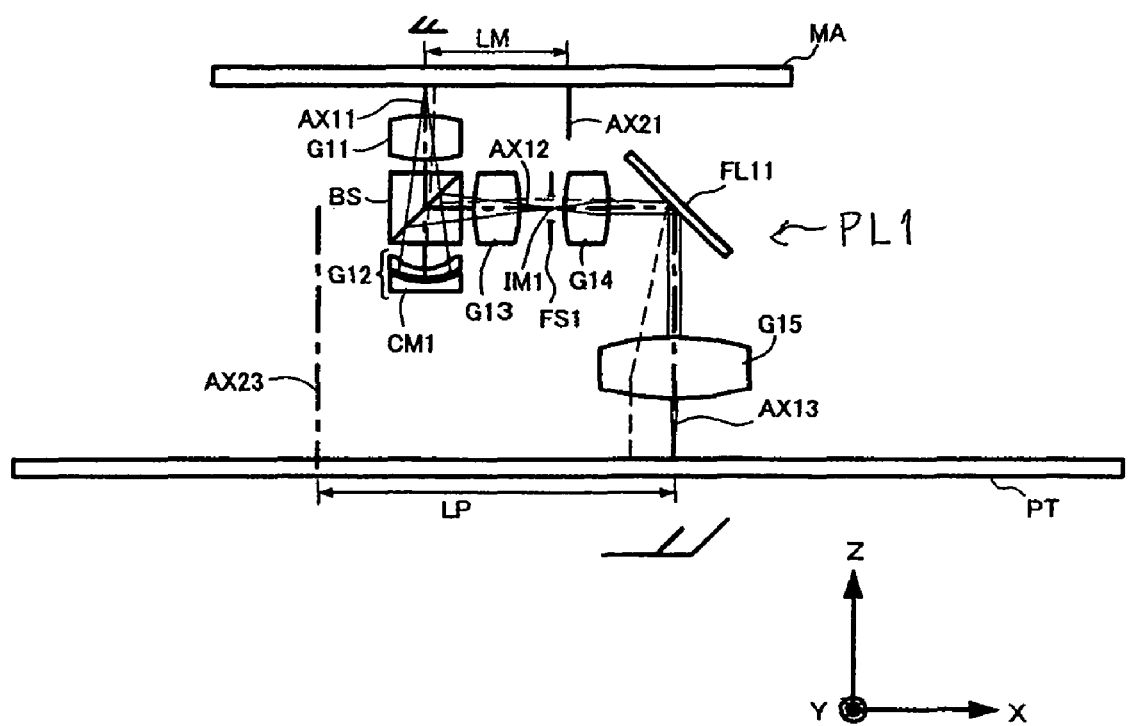
FIG. 17 is a diagram showing a projection optical system PL1 according to a first modification of the present invention.

FIG. 17 shows a first projection optical system PL1 according to a first modification of the present embodiment. In FIG. 17, in relation with a second projection optical system adjacent to the projection optical system PL1 in the non-scanning direction (Y-direction), only optical axes AX21 and AX23 of the second projection optical system are shown.

The first projection optical system PL1 of the first modification is a two-time imaging catadioptric system (optical system that forms a single intermediate image). The first projection optical system PL1 has a lateral magnification M with a negative value (M<−1) in the scanning direction and a lateral magnification M with a positive value (M>1) in the non-scanning direction. More specifically, the first projection optical system PL1 of the first modification forms a magnified inverted image of a rear surface (magnified inverted mirror image) of part of a pattern field formed on a mask MA.

The first projection optical system PL1 shown in FIG. 17 includes a first imaging optical system for forming an intermediate image IM1 and a second imaging optical system for imaging the intermediate image IM1 again onto the plate PT. The first imaging optical system includes a first group G11, which is arranged along an optical axis AX11 that extends in the direction of the normal to the surface of the mask MA, a beam splitter BS, which is either an amplitude splitter or a polarization beam splitter, a second group G12, which includes a concave mirror CM1, and a third group G13, which is arranged along an optical axis AX12 that is orthogonal to the optical axis AX11 and extends parallel to the scanning direction (X-direction). The second imaging optical system includes a fourth group G14, which is arranged along the optical axis AX12, an optical path deflecting mirror FL11 for deflecting the optical axis AX12 to generate an optical axis AX13, and a fifth group G15, which is arranged along the optical axis AX13 that is parallel to the optical axis AX11 and extends parallel to the direction of the normal to the plate PT.

A field stop FS1 is arranged at an intermediate image formation position between the first imaging optical system and the second imaging optical system. In the first modification, the field stop FS1 defines the viewing fields on the mask MA and the image fields on the plate PT. Accordingly, when the projection optical systems PL1 and PL2 or the like according to the first modification are used, the illumination unit IU shown in FIG. 1 can eliminate its optical system that includes the variable diaphragm 9d and the condenser lens 9e and defines the illumination field ILF1 and the like. The same applies to other modifications of the present embodiment, which will be described with reference to FIGS. 18 and 19. The viewing fields and the image fields according to the first modification shown in FIG. 17 are defined to include the optical axes AX11 and AX13 (on-axis viewing fields and on-axis image fields). Alternatively, the viewing fields and the image fields may be shifted from the optical axes AX11 and AX13. In other words, the viewing fields and the image fields may be off-axis viewing fields and off-axis image fields.

In the first modification, the splitting surface of the beam splitter BS corresponds to the first deflection member and the optical path deflecting mirror FL11 corresponds to the second deflection member. The direction in which the optical axis AX12 linking the beam splitter BS and the optical path deflecting mirror FL11 extends corresponds to the first deflection direction.

In the first modification, the X-direction distance LM between the first projection optical system PL1 and the second projection optical system on the mask MA (corresponding to the X-direction distance between the optical axis AX11 and AX21) and the X-direction distance LP between the first projection optical system PL1 and the second projection optical system on the plate PT (corresponding to the X-direction distance between the optical axis AX13 and AX23) satisfy LP=M*LM, where M is the enlargement magnification of the projection optical systems. However, this setting can be changed within the range in which 0≦LP≦M*LM is satisfied.

Figure 18A:
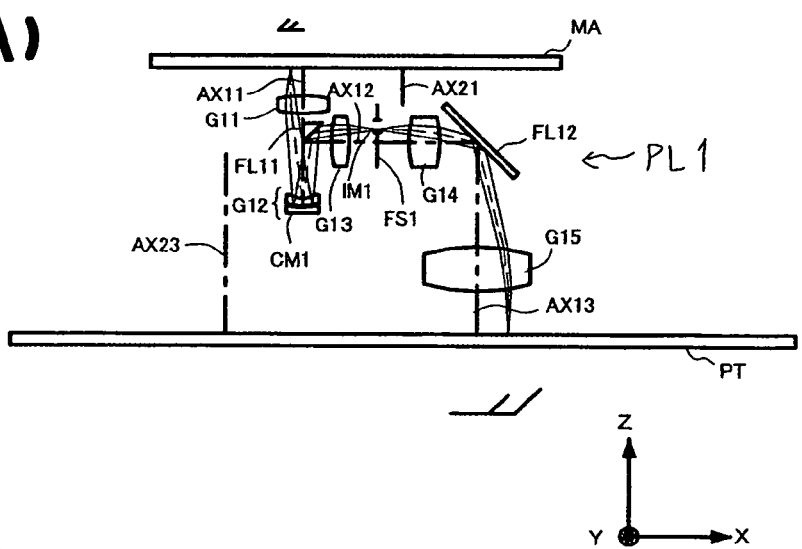
FIG. 18(A) is a diagram showing a projection optical system PL1 according to a second modification of the present invention.
Figure 18B:
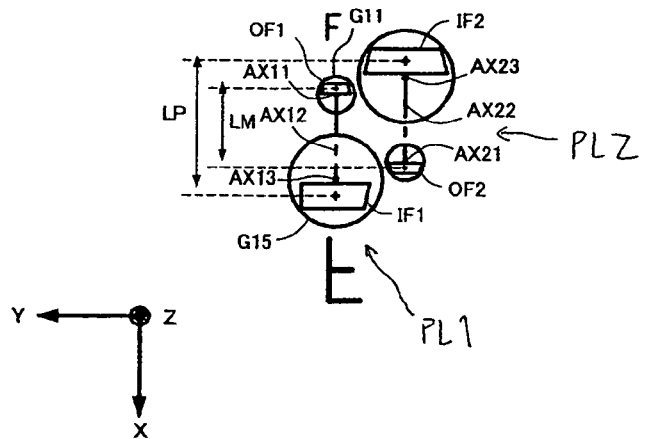
FIG. 18(B) is a plan view showing viewing fields and image fields according to the second modification.

FIG. 18(A) shows a first projection optical system PL1 according to a second modification as viewed in the Y-direction (non-scanning direction). FIG. 18(B) is a plan view showing viewing fields and image fields in the second modification. In FIG. 18(A), in relation with a second projection optical system adjacent to the first projection optical system PL1 in the non-scanning direction (Y-direction), only optical axes AX21 and AX23 of the second projection optical system are shown. Further, FIG. 18(B) only shows the first and second projection optical systems PL1 and PL2.

The first projection optical system PL1 according to the second modification shown in FIG. 18(A) is a two-time imaging catadioptric system (that forms a single intermediate image). The first projection optical system PL differs from the first projection optical system of the first modification shown in FIG. 17 in its optical path deflecting mirror FL11 for separating the incoming and outgoing optical paths of a concave reflection mirror with a viewing field separation technique. The first projection optical system PL of the second modification also has a lateral magnification being a negative value (M<−1) in the scanning direction and a lateral magnification M being a positive value (M>1) in the non-scanning direction. More specifically, the first projection optical system PL1 of the second modification forms a magnified inverted image of a rear surface (magnified inverted mirror image) of a part of a pattern field formed on a mask MA.

The first projection optical system PL1 in FIG. 18(A) includes a first imaging optical system for forming an intermediate image IM1 and a second imaging optical system for forming the intermediate image IM1 again onto the plate PT. The first imaging optical system includes a first group G11, which is arranged along an optical axis AX11 that extends in the direction of the normal to the mask MA, a second group G12, which includes a concave mirror CM1, and a third group G13, which is arranged along an optical axis AX12 that is orthogonal to the optical axis AX1 and extends parallel to the scanning direction (X-direction), and an optical path deflecting mirror FL11, which is arranged on an optical path between the second group G12 and the third group G13 and deflects the optical axis AX11 to generate an optical axis AX12. The second imaging optical system includes a fourth group G14, which is arranged along the optical axis AX12, an optical path deflecting mirror FL12, and a fifth group G15, which is arranged along an optical axis AX13 that is parallel to the optical axis AX11 and extends parallel to the direction of the normal to the plate PT.

A field stop FS1 is arranged at an intermediate image formation position between the first imaging optical system and the second imaging optical system. In the second modification, the field stop FS1 defines viewing fields on the mask MA and image fields on the plate PT. The viewing fields and the image fields of the second modification are off-axis viewing fields and off-axis image fields that are shifted from the optical axes AX11 and AX13.

In the second modification, the optical path deflecting mirror FL11 corresponds to the first deflection member and the optical path deflecting mirror FL12 corresponds to the second deflection member. The direction in which the optical axis AX12 linking the optical path deflecting mirrors FL11 and FL12 extends corresponds to the first deflection direction.

In the second modification, the X-direction distance LM between the center of the viewing field OF1 of the first projection optical system PL1 on the mask MA and the center of the viewing field OF2 of the second projection optical system PL2 on the mask MA and the X-direction distance LP between the center of the image field IF1 of the first projection optical system PL1 on the plate PT and the center of the image field IF2 of the second projection optical system PL2 on the plate PT satisfy LP=M*LM, where M is the enlargement magnification of the projection optical systems PL1 and PL2 as shown in FIG. 18(B). This arrangement can be changed within the range in which 0≦LP≦M*LM is satisfied. The conjugate point of the center of the viewing field OF1 of the first projection optical system PL1 is the center of the image field IF1, and the conjugate point of the center of the viewing field OF2 of the second projection optical system PL2 is the center of the image field IF2.

Figure 19A:
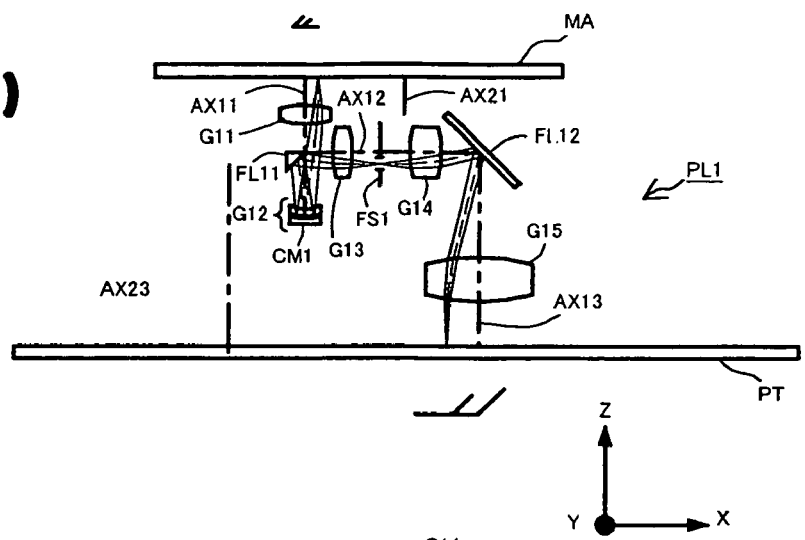
FIG. 19(A) is a diagram showing a projection optical system PL1 according to a third modification of the present invention.
Figure 19B:
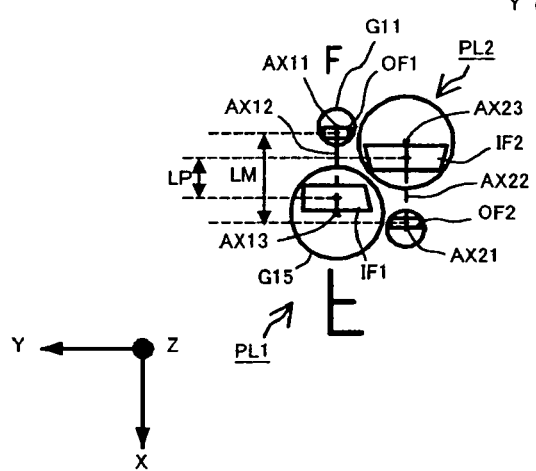
FIG. 19(B) is a plan view showing viewing fields and image fields according to the third modification.

FIG. 19(A) shows a first projection optical system PL1 according to a third modification as viewed in the Y-direction (non-scanning direction). FIG. 19(B) is a plan view showing viewing fields and image fields in the third modification. The projection optical system PL1 of the third modification shown in FIG. 19(A) differs from the projection optical system of the second modification shown in FIG. 18 only in that its optical path deflecting mirror FL11 is arranged to reflect light beams in a manner that the reflected light beams cross an optical axis AX11. The other structure of the projection optical system PL1 of the third modification is the same as the structure of the second modification. This particular arrangement of the optical path deflecting mirror FL11 causes a viewing field OF1 and an image field IF1, which are arranged outward from the optical axes AX11 and AX13 in the scanning direction (X-direction) in the projection optical system PL1 (FIG. 18(B)) of the second modification, to be positioned inward from optical axes AX11 and AX13 in the third modification. In the same manner, a viewing field OF2 and an image field IF2 of a projection optical system PL2 are arranged inward from optical axes AX21 and AX23.

In the third modification, the X-direction distance LM between the center of the viewing field OF1 of the first projection optical system PL1 on a mask MA and the center of a viewing field OF2 of the second projection optical system PL2 and the X-direction distance LP between the center of the image field IF1 of the first projection optical system PL1 on a plate PT and the center of an image field IF2 of the second projection optical system PL2 satisfy $0 \leq LP \leq M*LM$, where M is the enlargement magnification of the projection optical systems PL1 and PL2. In particular, the viewing fields OF1 and OF2 and the image fields IF1 and IF2 are arranged inward from the optical axes AX11, AX13, AX21, and AX23 in the scanning direction in the third modification. Thus, the setting is close to the lower limit value of the above conditional expression ($0 \leq LP \leq M*LM$). This arrangement of the third modification improves the exposure throughput as compared with the second modification. In the third modification, the conjugate point of the center of the viewing field OF1 of the first projection optical system PL1 is also the center of the image field IF1, and the conjugate point of the center of the viewing field OF2 of the second projection optical system PL2 is also the center of the image field IF2.

Figure 20:
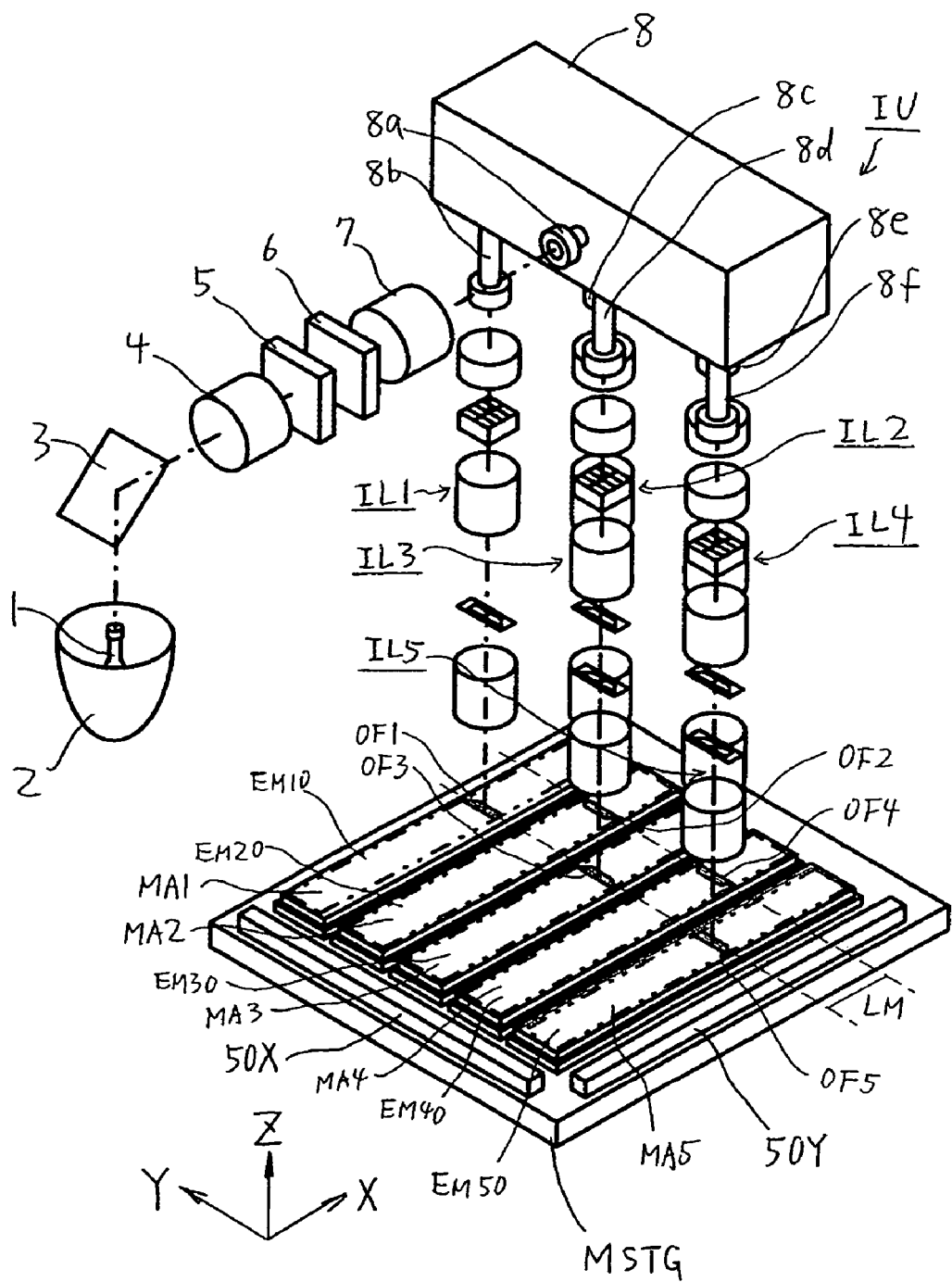
FIG. 20 is a perspective view of a mask stage MSTG shown in FIG. 1 on which a plurality of masks are mounted according to another embodiment of the present invention.

In the above embodiments, the single mask MA, on which the five pattern fields EM10 to EM50 are formed, is mounted on the mask stage MSTG as shown in FIG. 1. FIG. 20 shows another modification of the present embodiment. In the drawing, the components corresponding to the components shown in FIG. 1 are given the same reference numerals. Five masks MA1 to MA5 arranged at predetermined intervals in the Y-direction (non-scanning direction) and elongated in the X-axis direction (scanning direction) may be attracted to and held on the mask stage MSTG by a mask holder (not shown). Patterns of the pattern fields EM10 to EM50 shown in FIG. 1 may be respectively formed on the masks MA1 to MA5.

The mask stage MSTG and the substrate stage PSTG are scanned in the X-direction in synchronization with each other, while the patterns of the masks MA1 to MA5 of the modification shown in FIG. 20 are projected onto the plate PT by the projection optical systems PL1 to PL5 shown in FIG. 2. As a result, the patterns of the masks MA1 to MA5 are transferred onto the plate PT.

Third Embodiment

A third embodiment of the present invention will now be described with reference to FIGS. 21 to 24. In the third embodiment, a manufacturing method for a mask on which patterns are transferred using the projection optical apparatus PL of each of the above embodiments (e.g., the mask MA in FIG. 1) will be described.

Figure 21:
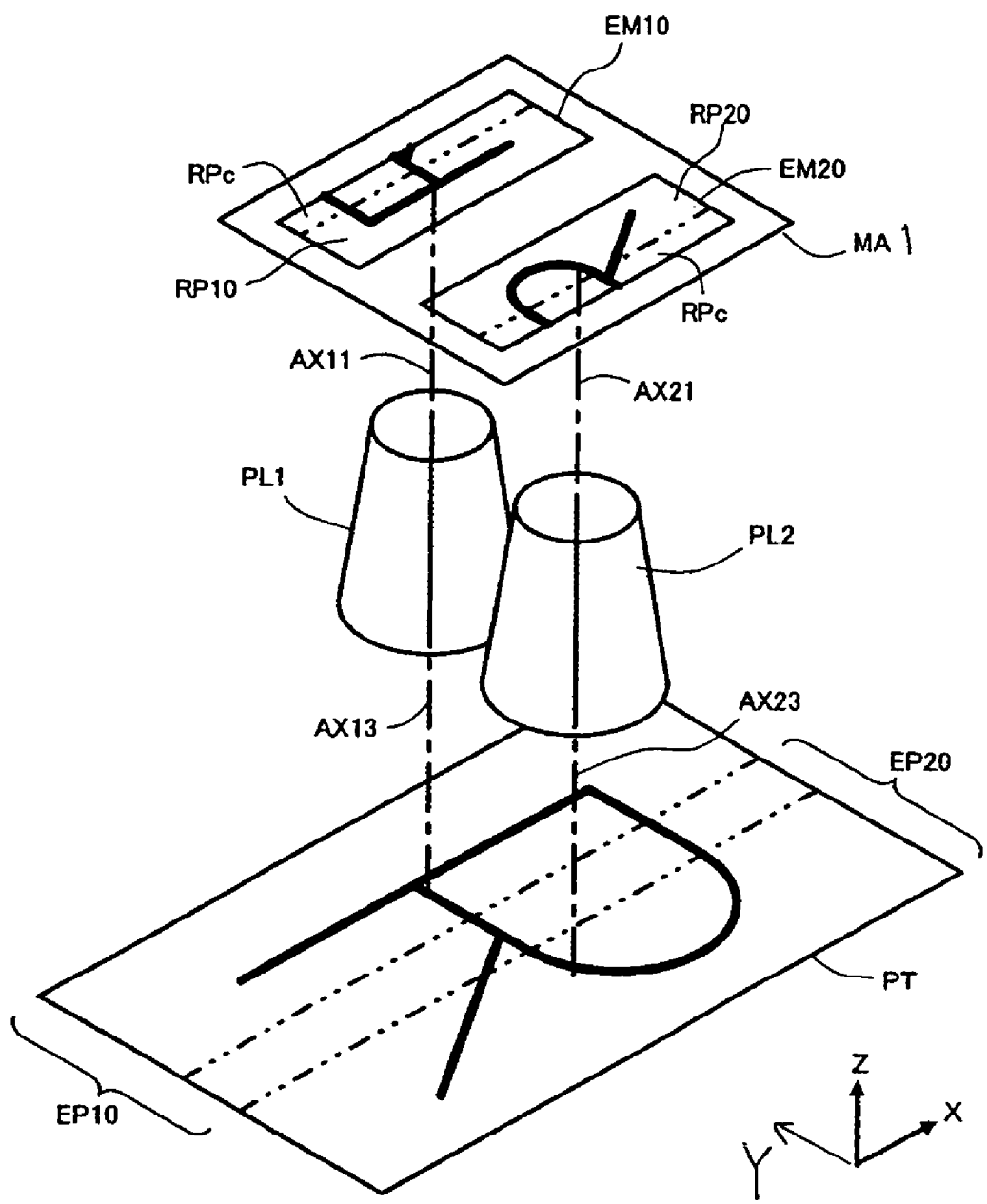
FIG. 21 is a perspective view showing transfer of mask patterns onto a plate using projection optical systems according to a third embodiment of the present invention.

FIG. 21 is a conceptual diagram describing the positional relationship between patterns of the mask and the patterns transferred onto the plate in the embodiment shown in FIGS. 1 and 2. In FIG. 21, a mask MA1 includes a pattern field EM10 in a first row and a pattern field EM20 in a second row, which are spaced from each other in a non-scanning direction (Y-direction). The pattern fields EM10 and EM20 have a length in the longitudinal direction that coincides with a scanning direction (X-direction).

The first-row pattern field EM10 includes a first pattern field RP10, of which has a length in the longitudinal direction coinciding with the scanning direction, and a common pattern field RPc, which is adjacent to the first pattern field RP10 in the non-scanning direction. The second-row pattern field EM20 includes a second pattern field RP20, of which longitudinal direction coincides with the scanning direction, and a common pattern field RPc, which is adjacent to the second pattern field RP20 in the non-scanning direction.

A pattern formed in the first-row pattern field EM10 in FIG. 21 is transferred onto a first exposure field EP20 on a plate PT by the first projection optical system PL1. A pattern formed in a second-row pattern field EM20 in FIG. 21 is transferred onto the second exposure field EP20 on the plate PT by the second projection optical system PL2. The first and second exposure fields EP10 and EP20 partially overlap each other in the non-scanning direction.

The projection optical systems PL1 and PL2 have a negative enlargement magnification in the scanning direction and a negative enlargement magnification in the non-scanning direction as described in the above embodiments. Thus, the patterns in the first-row first pattern fields RP10 and RP20 and the second-row pattern fields EM10 and EM20 are obtained by inverting patterns that are to be transferred using the non-scanning direction as the axis of symmetry and the scanning direction as the axis of symmetry. The patterns in the common pattern fields RPc of the pattern fields EM10 and EM20 include patterns obtained by inverting patterns included in the overlapping portion of the exposure fields EP10 and EP20 on the plate PT using the non-scanning as the axis of symmetry and the scanning direction as the axis of symmetry.

The method for manufacturing the mask MA1 shown in FIG. 21 will now be described with reference to FIGS. 22(A) to 22(D).

Figure 22A:
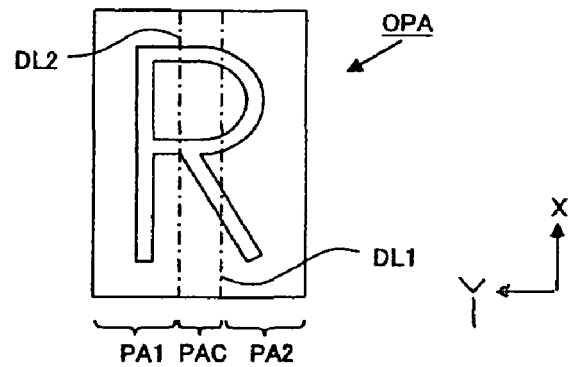
FIG. 22 is a diagram showing one example method for manufacturing a mask shown in FIG. 21.

FIG. 22(A) is a plan view showing an original pattern OPA corresponding to the pattern to be transferred onto the plate PT shown in FIG. 21. The original pattern OPA is not be limited to a pattern that is similar to the pattern transferred to the plate PT and may be, for example, a pattern obtained by subjecting the transferred pattern to OPC (optical proximity correction) for correcting the optical proximity of the pattern.

The original pattern OPA is first separated into a plurality of fields PA1, PA2, and PAC using separation lines DL1 and DL2 in accordance with the size and shape of the image fields of the projection optical systems PL1 and PL2 that are used. The first field PA1 corresponds to a field that is projected onto the plate PT by solely using the projection optical system PL1. The second field PA2 is a field that is projected onto the plate PT using solely the projection optical system PL2. The common field PAC is a field that is exposed in an overlapped manner onto the plate PT using both the first and second projection optical systems PL1 and PL2.

Figure 22B:
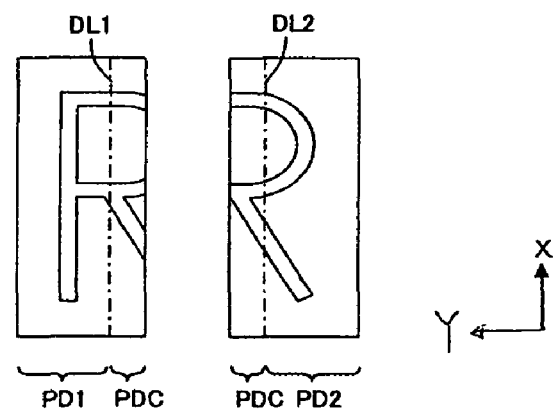

As shown in FIG. 22(B), pattern data including first pattern data PD1 and common pattern data PDC is extracted from the original pattern data. The first pattern data PD1 is the original pattern data positioned within the first field PA1. The common pattern data PDC is the original pattern data positioned within the common field PAC. Also, pattern data including second pattern data PD2 and common pattern data PDC is extracted from the original pattern data. The second pattern data PD2 is the original pattern data positioned within the second field PA2. The common pattern data PDC is the original pattern data positioned within the common field PAC.

Figure 22C:
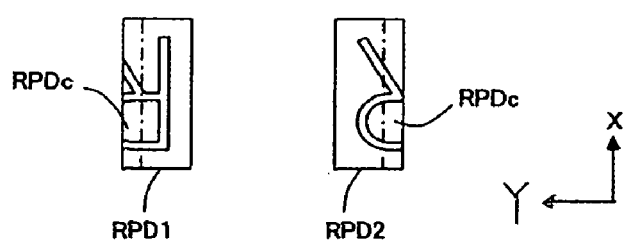

As shown in FIG. 22(C), the extracted pattern data for the first projection optical system PL1 and the extracted pattern data for the second projection optical system PL2 are reduced in accordance with the inverse of the enlargement magnification of the first and second projection optical systems PL1 and PL2. In the present embodiment, the first and second projection optical systems PL1 and PL2 have a negative enlargement magnification in the scanning direction and have a negative enlargement magnification in the non-scanning direction. Thus, the reduced pattern data becomes the first inverted pattern data RPD1, second inverted pattern data RPD2, and common inverted pattern data RPDc by inverting the first pattern data PD1, the second pattern data PD2, and the common pattern data PDC using the scanning direction as an axis and the non-scanning direction as an axis.

Figure 22D:
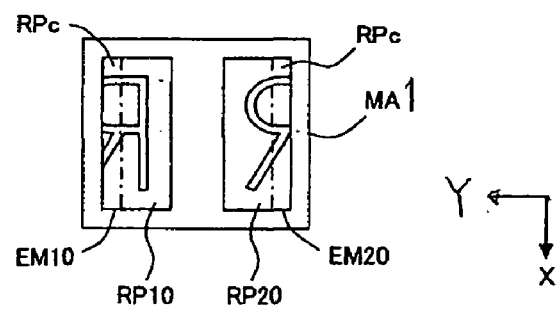

Based on the first inverted pattern data RPD1, the second inverted pattern data RPD2, and the common inverted pattern data RPDc, a first pattern field RP10, a second pattern field RP20, and a common pattern field RPc are written using a mask writer to form the first-row pattern field EM10 and the second-row pattern field EM20. FIG. 22(D) is a plan view of the mask MA that has been written. FIG. 22(D) is a plan view of the mask MA1 viewed from the pattern side of the mask MA1, that is, the projection optical system side of the mask MA1.

A mask pattern used when the projection optical systems has a negative enlargement magnification in the scanning direction and a positive enlargement magnification in the non-scanning direction and a manufacturing method for such a mask pattern will now be described with reference to FIGS. 23 and 24.

Figure 23:
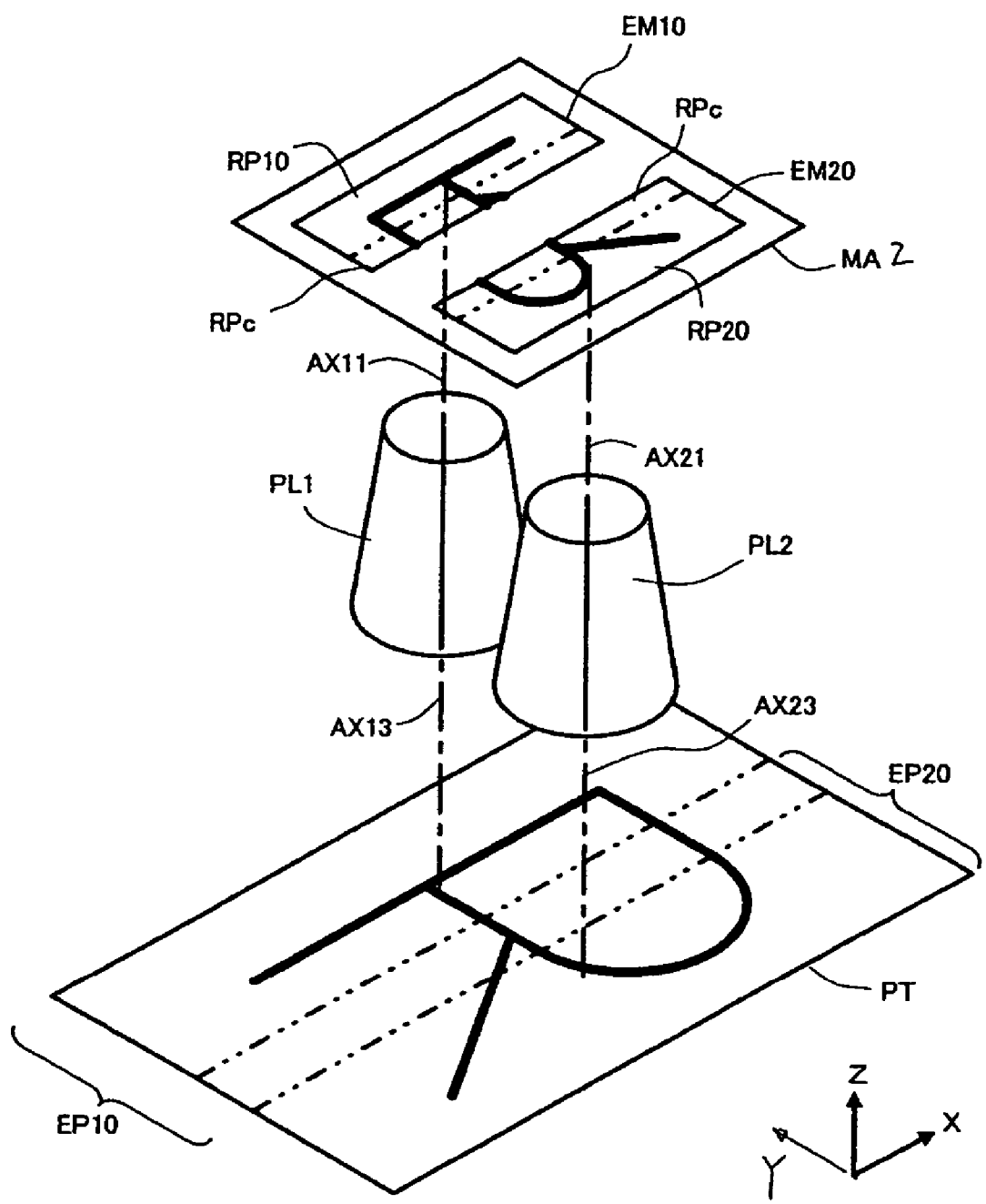
FIG. 23 is a perspective view showing transfer of other mask patterns onto a plate using other projection optical systems in the third embodiment.
Figure 24:
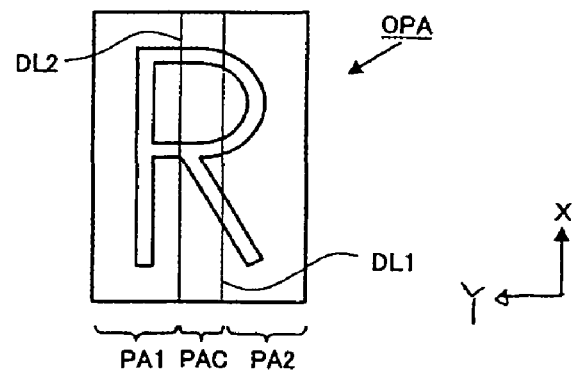
FIG. 24 is a diagram showing one example method for manufacturing a mask shown FIG. 23.
Figure 24:
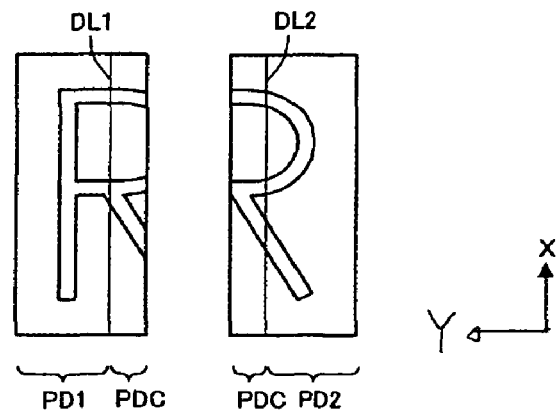
Figure 24:
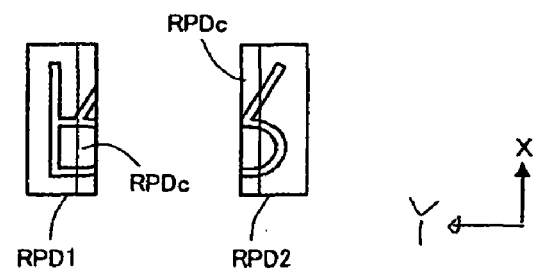
Figure 24:
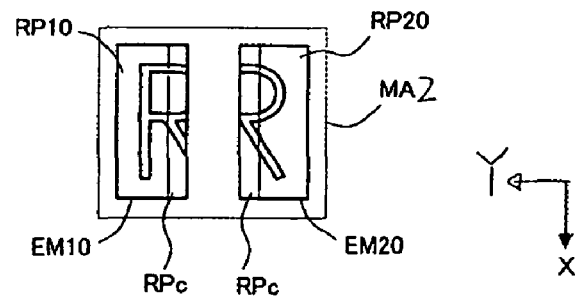

A mask MA2 shown in FIG. 23 differs from the mask MA1 shown in FIG. 21 in that patterns of its two-row pattern fields EM10 and EM20 of the mask MA2 are obtained by inverting the patterns in the pattern fields EM10 and EM20 in FIG. 21 with respect to an axis parallel to the scanning direction. The manufacturing method for the mask MA2 of FIG. 23 shown in FIGS. 24(A) to 24(D) differs from the manufacturing method for the mask MA1 shown in FIGS. 22(A) to 22(D) in that the first pattern data PD1, the second pattern data PD2, and the common pattern data PDC are inverted with respect the axis that is the non-scanning direction to generate the first inverted pattern data RPD1, the second inverted pattern data RPD2, and the common inverted pattern data RPDc as shown in FIGS. 24(B) and 24(C). The remaining parts of the manufacturing method is the same as the manufacturing method shown in FIG. 22 and will not be described.

Although the mask manufacturing method shown in FIGS. 21 to 24 uses the two projection optical systems PL1 and PL2, three or more projection optical systems may be used. For example, the mask MA including the pattern fields EM10 to EM50 in FIG. 1 can be manufactured using three or more projection optical systems using the mask data generated in the same manner as described above.

The mask may have the mask offset MO in the same manner as described in the above embodiments (e.g., the mask MA shown in FIG. 8). In this case, it is only required that the entire first-row pattern field EM10 and the entire second-row pattern field EM20 in FIG. 22(D) be shifted in the scanning direction by an amount corresponding to the mask offset MO.

The scanning projection exposure apparatus using the projection optical system PL of FIG. 1 in the above embodiment may be used to form a predetermined pattern (e.g., a circuit pattern or an electrode pattern) on a photosensitive substrate (glass plate) to manufacture a microdevice such as a liquid crystal display device. A method for manufacturing a liquid crystal display device using the scanning projection exposure apparatus will now be described with reference to a flowchart shown in FIG. 25.

In step S401 (pattern formation process) in FIG. 25, a coating process, an exposure process, and a developing process are preformed. In the coating process, a photosensitive substrate is prepared by coating a substrate, on which exposure is to be performed, with photoresist. In the exposure process, a pattern of a mask for a liquid crystal display device is transferred and exposed on the photosensitive substrate using the scanning projection exposure apparatus. In the developing process, the photosensitive substrate is developed. The coating process, the exposure process, and the developing process constitute a lithography process, through which a predetermined resist pattern is formed on the substrate. After the lithography process, an etching process using the resist pattern as a mask, a resist removing process, and other processes are performed. Through these processes, a predetermined pattern including a large number of electrodes is formed on the substrate. The lithography and other processes are performed a number of times in accordance with the number of layers formed on the substrate.

In step S402 (color filter formation process), a color filter is formed by arranging sets of three fine filters corresponding to red (R), green (G), and blue (B) in a matrix, or arranging sets of three striped R, G, and B filters in the horizontal scanning direction. In step S403 (cell assembly process), liquid crystal is injected between the substrate having a predetermined pattern, which is obtained for example through step S401, and the color filter, which is obtained for example through step S402. This completes a liquid crystal panel (liquid crystal cell).

In step S404 (module assembly process), other components including an electric circuit for enabling a display operation of the liquid crystal panel (liquid crystal cell) and a backlight are mounted on the completed liquid crystal panel (liquid crystal cell). This completes the manufacture of a liquid crystal display device. The manufacturing method for the liquid crystal display device described above uses the scanning projection exposure apparatus of the above embodiments that downsizes mask patterns in the scanning direction. This manufacturing method enables the mask stage to be downsized and consequently reduces the cost for the mask stage. With this manufacturing method, a liquid crystal display device is manufactured with a high precision. The manufacturing method uses the projection exposure apparatus that has a shorter idling distance. This manufacturing method enables the substrate stage to be downsized. With the manufacturing method, a liquid crystal display device is manufactured with a high exposure throughput with low cost.

The present invention should not be limited to the above embodiments but may be modified variously without departing from the scope and spirit of the present invention.

The device manufacturing method of the present embodiment uses the projection optical apparatus of the present embodiment in its exposure process. This enables projected images formed on a second object by a plurality of projection optical systems (in a plurality of rows) to be continuous from one another in a highly precise manner, and enables satisfactory pattern transfer. Further, the nested arrangement of the projection optical systems downsizes the projection optical apparatus having an enlargement magnification and reduces image oscillation. As a result, microdevices having large areas are manufactured at a low cost with high precision.

The method of the present embodiment further enables the pattern on the first object (mask or the like) to be downsized in the scanning direction or enables the scanning distance of the second object (plate or the like) to be shortened as necessary. When the pattern on the first object is downsized in the scanning direction, the pattern is formed with high precision and the stage for the first object is downsized. When the scanning distance of the second object is shortened, the base member for the second object is downsized and the exposure throughput is improved. As a result, microdevices are manufactured at a low cost as well as with high precision.

What is claimed is:

1. A projection optical apparatus for forming a magnified image of a first object on a second object, wherein the first object is arranged in a first plane, and the second object is arranged in a second plane relatively movable to the magnified image in a predetermined first direction, wherein a first view point and a second view point are set in the first plane, and a first conjugate point and a second conjugate point respectively corresponding to the first view point and the second view point are set in the second plane, the apparatus comprising:
    a first projection optical system which directs a light beam from the first view point to the first conjugate point and forms a magnified image of the first object in the first plane on the second object in the second plane; and
    a second projection optical system which directs a light beam from the second view point to the second conjugate point and forms a magnified image of the first object in the first plane on the second object in the second plane,
    wherein the first projection optical system includes a first light beam transfer member which shifts a position of the light beam from the first view point at least in the first direction,
    wherein the second projection optical system includes a second light beam transfer member which shifts a position of the light beam from the second view point at least in the first direction, and
    wherein a first line segment links a first projected point, which orthogonally projects the first view point, to the first conjugate point and a second line segment links a second projected point, which orthogonally projects the second view point, to the second conjugate point, and at least part of the first line segment and at least part of the second line segment overlap each other within the second plane as viewed in a second direction that is orthogonal to the first direction.

2. The projection optical apparatus according to claim 1, wherein at least one of the first line segment and the second line segment is parallel to the first direction.

3. The projection optical apparatus according to claim 1, wherein at least one of the first line segment and the second line segment is non-parallel to the first direction and the second direction.

4. The projection optical apparatus according to claim 1, wherein:
    the first light beam transfer member transfers the light beam from the first view point in a first deflection direction that is parallel to the first line segment; and
    the second light beam transfer member transfers the light beam from the second view point in a second deflection direction that is parallel to the second line segment.

5. The projection optical apparatus according to claim 4, wherein:
    the first light beam transfer member includes a first deflection member which deflects the light beam from the first view point in the first deflection direction and a second deflection member which deflects the light beam traveling in the first deflection direction toward the second plane; and
    the second light beam transfer member includes a third deflection member which deflects the light beam from the second view point in the second deflection direction and a fourth deflection member which deflects the light beam traveling in the second deflection direction toward the second plane.

6. The projection optical system according to claim 5, wherein:
    the first projection optical system includes a first partial optical system arranged on an optical path between the first plane and the first deflection member, a second partial optical system arranged on an optical path between the first deflection member and the second deflection member, and a third partial optical system arranged on an optical path between the second deflection member and the second plane; and
    the second projection optical system includes a fourth partial optical system arranged on an optical path between the first plane and the third deflection member, a fifth partial optical system arranged on an optical path between the third deflection member and the fourth deflection member, and a sixth partial optical system arranged on an optical path between the fourth deflection member and the second plane.

7. The projection optical system according to claim 4, wherein:
    when M represents an enlargement magnification of the first and second projection optical systems, LM represents a distance between the first view point and the second view point in the first direction, and LP represents a distance between the first conjugate point and the second conjugate point in the first direction, $0 \leq |LP| \leq |M*LM|$ is satisfied.

8. The projection optical apparatus according to claim 7, wherein:
    the enlargement magnification M and the distances LM and LP satisfy the equation of $LP=M*LM$.

9. The projection optical apparatus according to claim 1, wherein:
    the first plane includes first and second pattern fields, in which patterns projected onto the second object in the second plane by the first and second projection optical systems, the first and second pattern fields being arranged at a predetermined interval in a second direction that is orthogonal to the first direction and at the same position in the first direction; and
    the second plane includes first and second exposure fields, onto which an image of the pattern is projected by the first and second projection optical systems, wherein the first and second exposure fields contact or partially overlap each other in the second direction at the same position in the first direction.

10. The projection optical apparatus according to claim 1, wherein the first and second projection optical systems are image-side telecentric optical systems.

11. The projection optical apparatus according to claim 1, further comprising:
a third projection optical system which directs a light beam from a third view point on the first plane to a third conjugate point on the second plane corresponding to the third view point and forms a magnified image of the first object in the first plane on the second object in the second plane; and
a fourth projection optical system which directs a light beam from a fourth view point on the first plane to a fourth conjugate point on the second plane corresponding to the fourth view point and forms a magnified image of the first object in the first plane on the second object in the second plane;
wherein the third projection optical system includes a third light beam transfer member which transfers the light beam from the third view point to the third conjugate point by shifting the light beam from the third view point in a direction intersecting the first direction; and
wherein the fourth projection optical system includes a fourth light beam transfer member which transfers the light beam from the fourth view point to the fourth conjugate point by shifting the light beam from the fourth view point in a direction intersecting the first direction.

12. The projection optical apparatus according to claim 11, wherein the third and fourth projection optical systems are arranged outward from the first and second projection optical systems.

13. A projection exposure apparatus for exposing a second object with illumination light via a first object, the apparatus comprising:
an illumination optical system which illuminates the first object with the illumination light;
the projection optical apparatus according to claim 1 which forms an image of the first object illuminated by the illumination optical system on the second object; and
a stage mechanism which relatively moves the first object and the second object in the first direction using enlargement magnification of the projection optical apparatus as a velocity ratio.

14. A device manufacturing method comprising:
exposing a mask pattern onto a photosensitive substrate by operating the projection exposure apparatus according to claim 13; and
developing the photosensitive substrate that has been exposed in the exposing.

15. An exposure method for exposing a second object with illumination light via a first object, the method comprising:
illuminating the first object with the illumination light;
projecting an image of the illuminated first object onto the second object with the projection optical apparatus according to claim 1; and
relatively moving the first object and the second object using the enlargement magnification of the projection optical apparatus as a velocity ratio.

16. The projection optical apparatus according to claim 1, wherein the first view point is between the second view point and the second conjugate point for the first direction.

17. A projection optical apparatus for forming a magnified image of a first object on a second object, wherein the first object is arranged in a first plane, and the second object is arranged in a second plane spaced from the first plane, relatively movable to the magnified image in a predetermined first direction, the apparatus comprising:
a first-row projection optical system including a plurality of projection optical systems, each including a viewing field on a first row extending along a second direction that intersects the first direction; and
a second-row projection optical system including a plurality of projection optical systems, each including a viewing field on a second row extending along the second direction and differing from the first row;
wherein the first-row projection optical system forms, on the second plane, a plurality of image fields conjugate to the plurality of viewing fields of the first-row projection optical system along a third row;
wherein the second-row projection optical system forms, on the second plane, a plurality of image fields conjugate to the plurality of viewing fields of the second-row projection optical system along a fourth row; and
wherein the first row is between the second row and the fourth row and the second row is between the first row and the third row when the first to fourth rows are viewed in a direction linking the first plane and the second plane.

18. A projection exposure apparatus comprising:
the projection optical apparatus according to claim 17 which forms the magnified image of the first object on the second object; and
a stage mechanism which relatively moves the first object and the second object in the first direction using an enlargement magnification related with the first direction of the first-row projection optical system and the second-row projection optical system as a velocity ratio;
wherein the enlargement magnification of the first-row optical system and the second-row optical system related with the first direction is less than −1.

19. The projection exposure apparatus according to claim 18, wherein the stage mechanism includes a mask stage which holds a mask, wherein the mask includes patterns respectively projected onto the second object in the second plane by the first-row and second-row projection optical systems and includes integrally formed first and second pattern fields.

20. The projection exposure apparatus according to claim 18, wherein the stage mechanism includes a mask stage which holds a first mask and a second mask, with the first mask including a first pattern field containing a pattern projected onto the second plane by the first-row projection optical system is formed, and the second mask including a second pattern field containing a pattern projected onto the second plane by the second-row projection optical system.

21. A projection exposure apparatus for exposing a first object arranged in a first plane and a second object arranged in a second plane while relatively moving the first object and the second object in a predetermined scanning direction, wherein the first plane includes a first viewing field and a second viewing field, and the second plane includes a first projection field and a second projection field, the apparatus comprising:
a first projection optical system which projects a magnified image of part of the first object in the first viewing field onto the first projection field of the second plane;
a second projection optical system which projects a further magnified image of part of the first object in the second viewing field onto the second projection field of the second plane; and
a stage mechanism which relatively moves the first object and the second object in the scanning direction using an enlargement magnification related with the scanning direction as a velocity ratio, wherein the enlargement magnification of the first projection optical system and the second projection optical system related with the scanning direction is less than −1;

a first-row projection optical system including a plurality of projection optical systems, each including a viewing field on a first row extending along a non-scanning direction that intersects the scanning direction; and a second-row projection optical system including a plurality of projection optical systems, each including a viewing field on a second row extending along the non-scanning direction and differing from the first row;

wherein the first-row projection optical system forms on a third row a plurality of imaging fields conjugate to the plurality of viewing fields of the first-row projection optical system;

wherein the second-row projection optical system forms on a fourth row a plurality of imaging fields conjugate to the plurality of viewing fields of the second-row projection optical system; and wherein the first row is between the second row and the fourth row and the second row is between the first row and the third row when the first to fourth rows are viewed in a direction linking the first plane and the second plane.

* * * * *